(12) United States Patent
Khoini-Poorfard et al.

(10) Patent No.: US 8,983,419 B2
(45) Date of Patent: *Mar. 17, 2015

(54) INTEGRATED RECEIVER AND INTEGRATED CIRCUIT HAVING INTEGRATED INDUCTORS AND METHOD THEREFOR

(71) Applicant: Silicon Laboratories Inc., Austin, TX (US)

(72) Inventors: Ramin Khoini-Poorfard, Austin, TX (US); Alessandro Piovaccari, Austin, TX (US); Aslamali A. Rafi, Austin, TX (US); Mustafa H. Koroglu, Austin, TX (US); David S. Trager, San Marcos, TX (US); Abdulkerim L. Coban, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/195,064

(22) Filed: Mar. 3, 2014

(65) Prior Publication Data

US 2014/0176806 A1   Jun. 26, 2014

Related U.S. Application Data

(60) Division of application No. 13/923,824, filed on Jun. 21, 2013, now Pat. No. 8,706,069, which is a continuation of application No. 13/160,564, filed on Jun. 15, 2011, now Pat. No. 8,494,470, which is a continuation-in-part of application No. 12/277,866, filed on Nov. 25, 2008, now Pat. No. 8,145,172.

(51) Int. Cl.
*H04B 1/06* (2006.01)
*H04N 5/50* (2006.01)
(Continued)

(52) U.S. Cl.
CPC .. *H04N 5/50* (2013.01); *H04B 1/30* (2013.01); *H04B 1/28* (2013.01); *H03H 11/04* (2013.01); *H04N 5/455* (2013.01)
USPC ............ 455/266; 455/256; 455/339; 455/340

(58) Field of Classification Search
USPC .................. 455/255, 256, 266, 337, 339, 340
See application file for complete search history.

(56) References Cited

U.S. PATENT DOCUMENTS 2,080,560 A   5/1937   Case
4,316,108 A   2/1982   Rogers, Jr.
(Continued)

OTHER PUBLICATIONS

"Applications of Switched-Capacitor Circuits in Active Filters and Instrumentation Amplifiers," Dr. William R. Grisé, Department of IET, Morehead State University, Technology Interface, vol. 3 No. 3, Fall 1999, ISSN# 1523-9926.
(Continued)

*Primary Examiner* — William Hernandez
(74) *Attorney, Agent, or Firm* — Polansky & Associates, P.L.L.C.; Paul J. Polansky

(57) ABSTRACT

An integrated receiver includes a first signal processing path, a second signal processing path, and a controller. The first signal processing path has an input and an output for providing a first processed signal, and comprises a first tracking bandpass filter having a first integrated inductor formed with windings in a first number of metal layers of the integrated receiver. The second signal processing path has an input and an output for providing a second processed signal, and comprises a second tracking bandpass filter having a second integrated inductor formed with windings in a second number of metal layers of the integrated receiver. The second number of windings is lower than the first number. The controller enables one of the first and second signal processing paths corresponding to a selected channel of a radio frequency (RF) input signal to provide an output signal.

20 Claims, 9 Drawing Sheets

(51) Int. Cl.
  *H04B 1/30* (2006.01)
  *H04B 1/28* (2006.01)
  *H03H 11/04* (2006.01)
  *H04N 5/455* (2006.01)

(56) References Cited

U.S. PATENT DOCUMENTS

| | | | |
|---|---|---|---|
| 4,361,909 A | 11/1982 | Theriault |
| 4,364,116 A | 12/1982 | Nossek |
| 4,368,541 A | 1/1983 | Evans |
| 4,408,348 A | 10/1983 | Theriault |
| 5,577,235 A | 11/1996 | Mitra |
| 5,646,935 A | 7/1997 | Ishikawa et al. |
| 5,737,035 A | 4/1998 | Rotzoll |
| 6,097,273 A | 8/2000 | Frye |
| 6,177,964 B1 | 1/2001 | Birleson et al. |
| 6,266,522 B1 | 7/2001 | Holden |
| 6,377,315 B1 | 4/2002 | Carr et al. |
| 6,377,788 B1 | 4/2002 | Elder |
| 6,453,157 B1 | 9/2002 | Roberts |
| 6,535,722 B1 | 3/2003 | Rosen |
| 6,549,096 B2 | 4/2003 | Groves et al. |
| 6,681,102 B1 | 1/2004 | Collier |
| 6,778,117 B1 | 8/2004 | Johnson |
| 6,915,114 B2 | 7/2005 | Khorram |
| 6,917,328 B2 | 7/2005 | Rabinowitz et al. |
| 7,039,385 B1 | 5/2006 | Hoffman |
| 7,075,585 B2 | 7/2006 | Favrat et al. |
| 7,095,454 B2 | 8/2006 | Waight |
| 7,158,774 B2 | 1/2007 | Helio |
| 7,231,192 B2 | 6/2007 | Suzuki |
| 7,251,466 B2 | 7/2007 | Porret et al. |
| 7,265,792 B2 | 9/2007 | Favrat et al. |
| 7,305,223 B2 | 12/2007 | Liu et al. |
| 7,327,406 B2 | 2/2008 | Utsunomiya et al. |
| 7,395,548 B2 | 7/2008 | Runzo |
| 7,577,413 B2 | 8/2009 | He |
| 7,620,379 B2 | 11/2009 | Isaac |
| 7,899,431 B2 | 3/2011 | Rahman et al. |
| 7,973,603 B2 | 7/2011 | Kammula |
| 8,103,233 B2 | 1/2012 | Im |
| 8,185,076 B2 | 5/2012 | Miura et al. |
| 8,301,208 B2 | 10/2012 | Katsube et al. |
| 2005/0040909 A1 | 2/2005 | Waight |
| 2006/0040628 A1* | 2/2006 | Porret et al. ........... 455/234.1 |
| 2006/0064725 A1 | 3/2006 | Rabinowitz et al. |
| 2006/0078069 A1 | 4/2006 | Seendripu et al. |
| 2007/0165143 A1 | 7/2007 | Utsunomiya et al. |
| 2008/0096508 A1 | 4/2008 | Luff |
| 2008/0181337 A1 | 7/2008 | Maxim |
| 2008/0198269 A1 | 8/2008 | Gomez |
| 2009/0176467 A1 | 7/2009 | Im |
| 2009/0251618 A1 | 10/2009 | Gao |
| 2010/0097531 A1 | 4/2010 | Miura et al. |
| 2010/0130155 A1 | 5/2010 | Khoini-Poorfard |
| 2012/0302188 A1 | 11/2012 | Sahota |

OTHER PUBLICATIONS

"Novel LC Pseudo Switched Capacitor Filter Suited for Wireless RF Applications," Ahmed El Oualkadi et al., IEICE Electronics Express, vol. 2, No. 8, Apr. 2005, pp. 286-291.

* cited by examiner

INTEGRATED RECEIVER AND INTEGRATED CIRCUIT HAVING INTEGRATED INDUCTORS AND METHOD THEREFOR

This application is a division of application Ser. No. 13/923,824, filed Jun. 21, 2013, which is a continuation of application Ser. No. 13/160,564, filed Jun. 15, 2011, now U.S. Pat. No. 8,494,470, which is a continuation-in-part of application Ser. No. 12/277,866, filed Nov. 25, 2008, now U.S. Pat. No. 8,145,172.

FIELD OF THE DISCLOSURE

The present disclosure relates generally to a radio frequency (RF) receiver and, more particularly relates to an RF receiver using a tracking filter.

BACKGROUND

Radio frequency (RF) receivers are used in a wide variety of applications such as television receivers, cellular telephones, pagers, global positioning system (GPS) receivers, cable modems, cordless phones, satellite radio receivers, and the like. As used herein, a "radio frequency" signal means an electrical signal conveying useful information and having a frequency from about 3 kilohertz (kHz) to thousands of gigahertz (GHz), regardless of the medium through which such signal is conveyed. Thus an RF signal may be transmitted through air, free space, coaxial cable, fiber optic cable, etc. One common type of RF receiver is the so-called superheterodyne receiver. A superheterodyne receiver mixes the desired data-carrying signal with the output of tunable oscillator to produce an output at a fixed intermediate frequency (IF). The fixed IF signal can then be conveniently filtered and converted back down to baseband for further processing. Thus a superheterodyne receiver requires two mixing steps.

For example, a television receiver may translate one channel in the band of 48 megahertz (MHz) to 870 MHz to an intermediate frequency of 44 MHz. And within the United States, FM radios will typically translate FM audio signals, which are broadcast in 200 KHz channels in the frequency band from 88.1 MHz to 107.9 MHz, to an intermediate frequency of 10.7 MHz. Because of the wide frequency range required of television receivers, it has been difficult to design high quality television receivers at low cost.

High quality television receivers have been traditionally formed with discrete components such as inductors, varactors, and capacitors. While the performance of these receivers has been good, they are expensive and bulky. It would be desirable to utilize the cost advantage of modern integrated circuit technologies. Unfortunately, existing silicon-based television tuners do not perform as well as discrete tuners and have not become significant in the marketplace. Moreover, television receivers that do use integrated circuit technology while retaining acceptable performance have still required external, discrete components, adding to their cost. Thus the promise of integrated circuit technology in reducing the cost of television receivers has not been fully realized.

What is needed, then, are new receiver architectures for applications such as television receivers that retain the high performance of discrete receivers but also take advantage of the reduction in cost afforded by integrated circuit technology.

BRIEF DESCRIPTION OF THE DRAWINGS

The present disclosure may be better understood, and its numerous features and advantages made apparent to those skilled in the art by referencing the accompanying drawings, in which.

The use of the same reference symbols in different drawings indicates similar or identical items.

DETAILED DESCRIPTION

In general, a receiver as described herein uses a tracking bandpass filter for channel tuning. The tracking bandpass filter includes an inductor that is fabricated on an integrated passive device (IPD) die. The receiver combines the IPD die and a main integrated circuit die into a single multi-chip module (MCM). Thus to the user the receiver appears to be a single integrated circuit. However the IPD die is well suited to building inductors without using the relatively more-expensive silicon manufacturing process. Thus, high quality, low cost, and compact size are obtained simultaneously.

Figure 1:
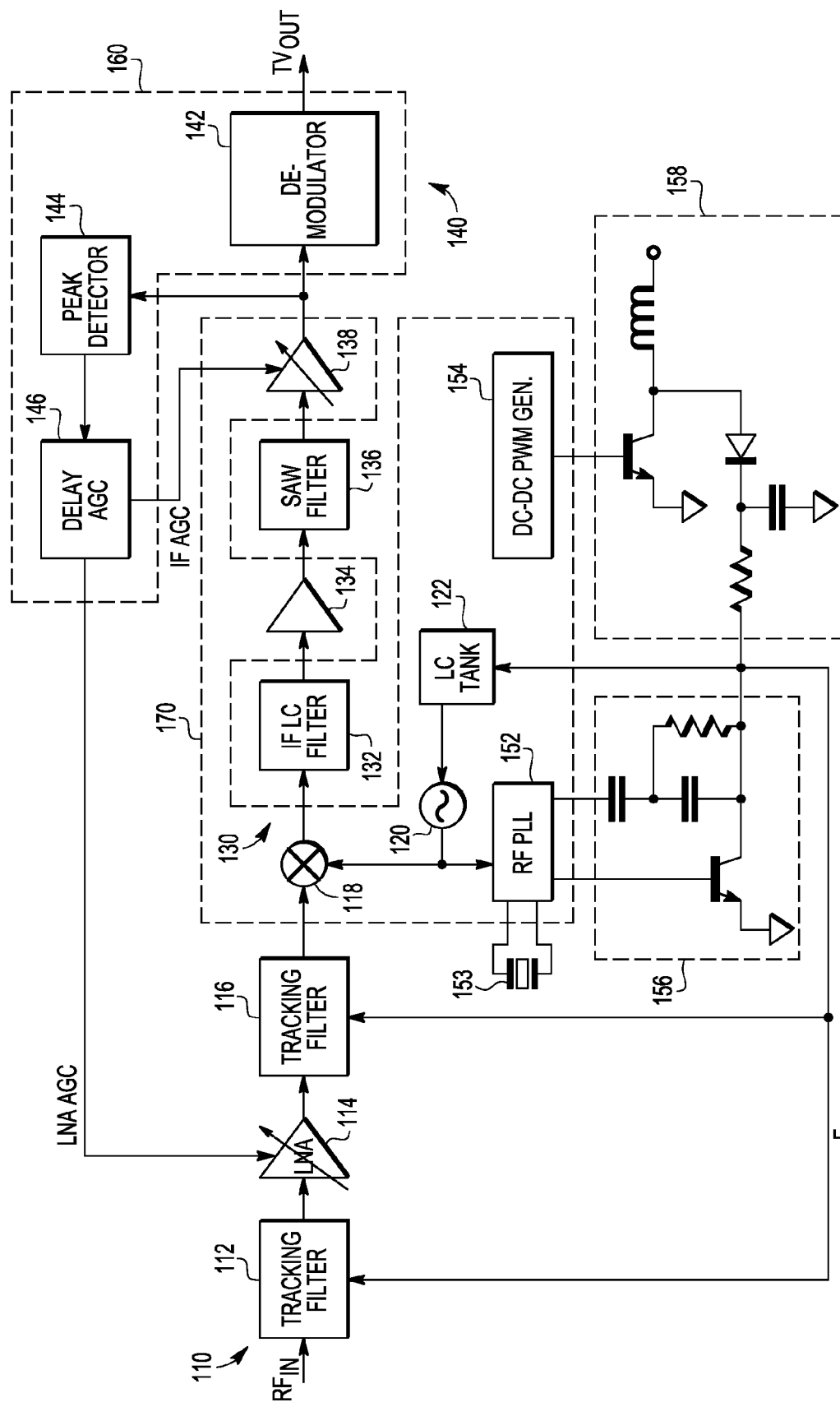
FIG. 1 illustrates in partial block diagram and partial schematic form a first television receiver known in the prior art.

In order to understand the difficulty of known receiver designs to simultaneously achieve both high quality filtering and low cost, reference is now made to FIG. 1, which illustrates in partial block diagram and partial schematic form a first television receiver 100 known in the prior art. Receiver 100 includes one or more radio frequency (RF) sections 110, an intermediate frequency (IF) section 130, a demodulator section 140, a radio frequency (RF) phase-locked loop (PLL) 152, a crystal 153, a DC-to-DC pulse width modulation (PWM) generator 154, a loop filter 156, and a varactor voltage control circuit 158. RF section 110 includes a tracking filter 112, a low-noise amplifier (LNA) 114, a tracking filter 116, a mixer 118, a local oscillator 120, and a tank circuit 122. IF section 130 includes an intermediate frequency (IF) filter 132, an IF gain stage 134, a surface acoustic wave (SAW) filter 136, and a variable gain IF gain stage 138. Demodulator section 140 includes a demodulator 142, a peak detector 144, and a delay automatic gain control (AGC) 146.

Tracking filter 112 has a first input for receiving a radio frequency (RF) input signal labeled "$RF_{IN}$", a second input for receiving a center frequency adjustment voltage labeled "$F_{CENTER}$", and an output. LNA 114 has a first input connected to the output of tracking filter 112, a second input for receiving a gain control signal labeled "LNA AGC", and an output. Tracking filter 116 has a first input connected to the output of LNA 114, a second input for receiving voltage $F_{CENTER}$, and an output. Mixer 118 has a first input connected to the output of tracking filter 116, a second input, and an output. IF filter 132 has an input connected to the output of mixer 118, and an output. IF gain stage 134 has an input connected to the output of IF filter 132, and an output. SAW filter 136 has an input connected to the output of IF gain stage 134, and an output. Variable gain IF gain stage 138 has a first input connected to the output of SAW filter 136, a second input, and an output. Demodulator 142 has an input connected to the output of variable gain IF gain stage 138, and an output for providing a demodulated output signal labeled "TV$_{OUT}$".

Peak detector 144 has an input connected to the output of variable gain IF gain stage 138, and an output. Delay AGC 146 has an input connected to the output of peak detector 144, a first output for providing a gain adjustment signal labeled "IF AGC" connected to the second input of variable gain IF gain stage 138, and a second output for providing signal LNA AGC connected to the second input of LNA 114.

RF PLL 152 has a first input, a second input connected to crystal 153, a first output and a second output. Loop filter 156 has a first input connected to the first output of RF PLL 152, a second input connected to the second output of RF PLL 152, and an output for providing voltage F$_{CENTER}$ connected to the second input of tracking filter 112 and to the second input of tracking filter 116. DC-DC PWM GENERATOR 154 has an output. Varactor voltage control circuit 158 has an input connected to the output of DC-DC PWM GENERATOR 154, and an output connected to the output of loop filter 156. Tank circuit 122 has an input for receiving voltage F$_{CENTER}$ from the output of loop filter 156, and an output. Local oscillator 120 has an input connected to the output of tank circuit 122, and an output connected to the second input of mixer 118 and also connected to the input of RF PLL 152.

Receiver 100 exhibits a degree of integration wherein mixer 118, IF gain stage 134, variable gain IF gain stage 138, local oscillator 120, RF PLL 152 and DC-DC PWM generator 154 are included in a single integrated device known as a MOPLL 170 (i.e., Mixer, Oscillator, PLL). Further, demodulator 142, peak detector 144, and delay AGC 146 are included in a single integrated device known as a demodulator die 160. Receiver 100 also includes several discrete elements, including tracking filter 112, LNA 114, tracking filter 116, IF filter 132, SAW filter 136, the circuit elements of the loop filter 156 and the varactor voltage control circuit 158.

In operation, signal RF$_{IN}$ is a broadband signal that includes energy from several television signals modulated onto carrier waves at different frequencies. The different carrier waves constitute the television channels from which television content can be received. Signal RF$_{IN}$ can be received from an antenna, or from a cable television connection. Tuning into a desired television channel involves passing signal RF$_{IN}$ through tracking filter 112 and tracking filter 116 to reduce the energy from the television signals modulated onto carrier waves outside of the desired television channel carrier wave frequency band. Tracking filter 112 and tracking filter 116 include inductors and capacitors configured to give the desired order of bandpass L-C (i.e., inductor-capacitor) filter response. LNA 114 is included to amplify the tuned signal while introducing minimal noise products. Mixer 118 mixes the tuned signal with the output from local oscillator 120 and produces sum and difference output frequencies:

$$f_1 = f_{CW} + f_{LO} \quad [1]$$

and $$f_2 = f_{CW} - f_{LO} \quad [2]$$

where $f_{CW}$ is the frequency of the desired carrier wave of the tuned signal, and $f_{LO}$ is the local oscillator frequency. Local oscillator 120 has an output frequency that is set by tank circuit 122. Tank circuit 122 is a resonant L-C circuit. The signal component $f_1$ is a higher frequency signal that is filtered out by IF filter 132. IF filter 132 is a lowpass L-C filter. The component $f_2$ is an intermediate frequency IF signal that includes the desired channel at a selected IF that is passed by IF filter 132. The IF signal is further conditioned by IF gain stage 134, SAW filter 136, and variable gain IF gain stage 138 before being demodulated into signal TV$_{OUT}$ by demodulator 160. Peak detector 144 detects power levels at the input of demodulator 142, and provides feedback input to delay AGC 146 which adjusts the gain at LNA 114 and variable gain IF gain stage 138, so that the power level of the tuned RF signal is not too high or too low.

In order to have the ability to tune in more than one television channel, receiver 100 includes a tuning mechanism that adjusts the center frequency of tracking filter 112 and tracking filter 116, and the frequency of the output of local oscillator 120. Tracking filter 112, tracking filter 116, and tank circuit 122 include high quality inductors that are typically air wound, and are not easily tuned to change circuit performance. On the other hand, the capacitors are implemented with varactors, that is, reverse-biased diodes designed such that the capacitance varies with the applied voltage. The varactors are thus tunable by varying the applied reverse-bias voltage. The reverse-bias voltage used to achieve the desired capacitance can be up to 30 volts (V) or higher. Loop filter 156 and varactor voltage control circuit 158 serve to adjust the voltage applied to the varactors in tracking filter 112, tracking filter 116, and tank circuit 122 to tune to the various television channels.

Receiver 100 includes features which are not easily adaptable to higher levels of integration. In particular, tracking filter 112, tracking filter 116, and tank circuit 122 include high quality inductors that are typically hand tuned at the time of manufacture to ensure proper tuning performance in operation. Additionally, the use of varactors requires the addition of the components associated with loop filter 156, and with varactor voltage control circuit 158 and DC-DC PWM generator 154, which together function as a DC-to-DC converter. Also, use of SAW filter 136 increases both the cost and the physical size of receiver 100. Receiver 100 also requires wide tuning ranges for tracking filter 112, tracking filter 116, and local oscillator 120.

Figure 2:
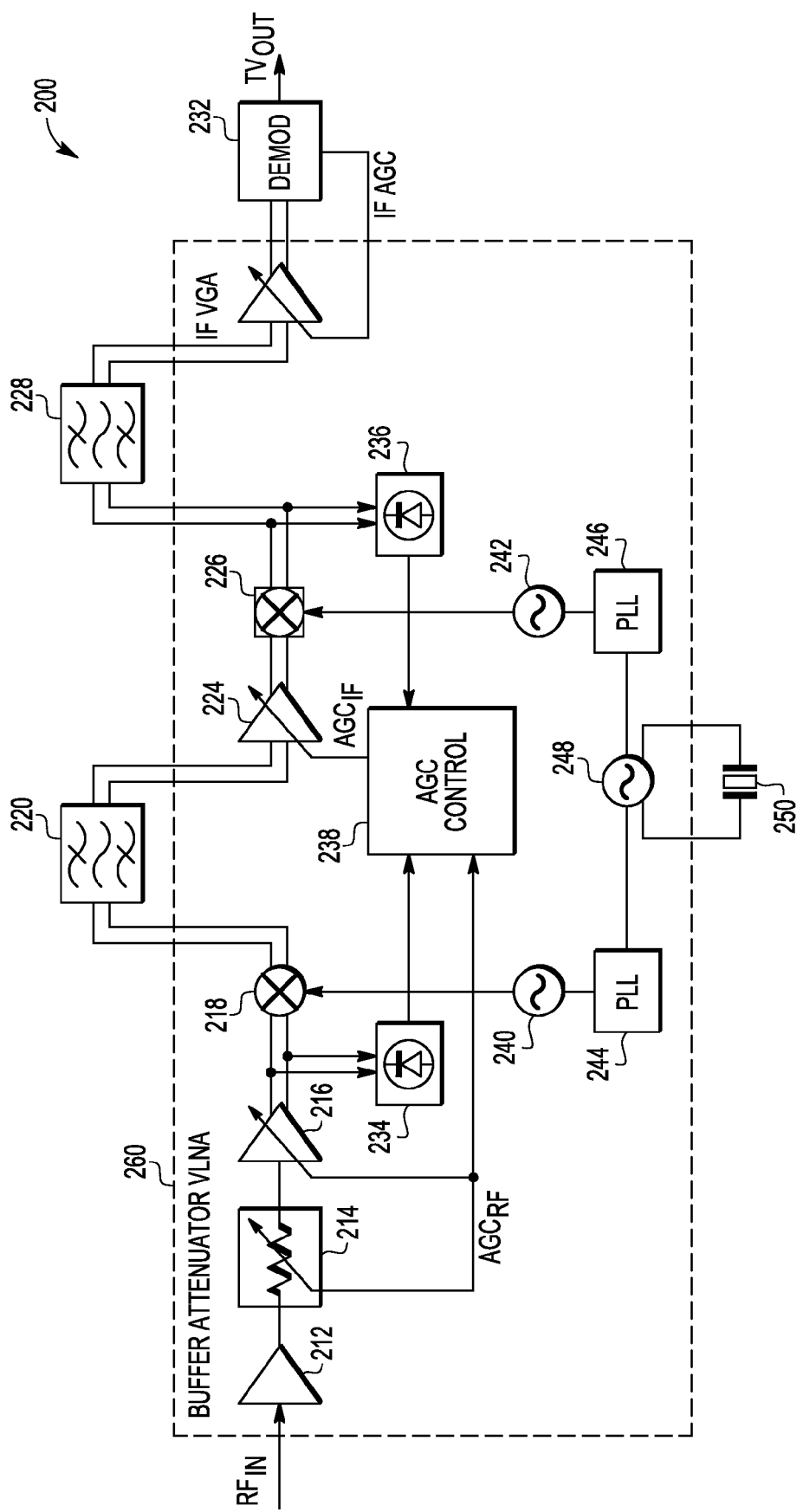
FIG. 2 illustrates in partial block diagram and partial schematic form a second television receiver known in the prior art.

Another known receiver architecture is shown in FIG. 2, which illustrates in partial block diagram and partial schematic form a second television receiver 200 known in the prior art. Receiver 200 is an up-down receiver and includes a buffer 212, an attenuator 214, a variable low-noise amplifier (VLNA) 216, an RF mixer 218, a SAW filter 220, a variable gain IF amplifier 224, an IF mixer 226, a SAW filter 228, a variable gain IF amplifier 230, a demodulator 232, power detectors 234 and 236, an automatic gain control (AGC) circuit 238, local oscillators 240 and 242, phase-locked loops (PLLs) 244 and 246, a crystal oscillator 248, and a crystal 250.

Buffer 212 has an input for receiving an RF input signal RF$_{IN}$, and an output. Attenuator 214 has a first input connected to the output of buffer 212, a second input, and an output. VLNA 216 has a first input connected to the output of attenuator 214, a second input, and an output. RF mixer 218 has a first input connected to the output of VLNA 216, a second input, and an output. SAW filter 220 has an input connected to the output of RF mixer 218, and an output. Variable gain IF amplifier 224 has a first input connected to the output of SAW filter 220, a second input, and an output. IF mixer 226 has a first input connected to the output of variable gain IF amplifier 224, a second input, and an output. SAW filter 228 has an input connected to the output of IF mixer 226, and an output. Variable gain IF amplifier 230 has a first input connected to the output of SAW filter, a second input, and an output. Demodulator 232 has an input connected to the output of variable gain IF amplifier 230, a first output for providing a demodulated output signal $TV_{OUT}$, and a second output for providing an AGC signal IF AGC connected to the second input of the variable gain IF amplifier 230.

Power detector 234 has an input connected to the output of VLNA 216, and an output. Power detector 236 has an input connected to the output of IF mixer 226, and an output. AGC circuit 238 has a first input connected to the output of power detector 234, a second input connected to the output of power detector 236, a first output for providing an AGC signal labeled "$AGC_{RF}$" connected to the second input of attenuator 214 and also connected to the second input of VLNA 216, and a second output for providing an AGC signal labeled "$AGC_{IF}$" connected to the second input of variable gain IF amplifier 224. Crystal oscillator 248 is connected to crystal 250, and has a first output and a second output. PLL 244 has an input connected to the first output of crystal oscillator 248, and an output. Local oscillator 240 has an input connected to the output of PLL 244 and an output connected to the second input of RF mixer 218. PLL 246 has an input connected to the second output of crystal oscillator 248, and an output. Local oscillator 242 has an input connected to the output of PLL 246 and an output connected to the second input of IF mixer 226. Receiver 200 exhibits a degree of integration wherein buffer 212, attenuator 214, variable low-noise amplifier (VLNA) 216, RF mixer 218, variable gain IF amplifier 224, IF mixer 226, variable gain IF amplifier 230, power detectors 234 and 236, AGC circuit 238, local oscillators 240 and 242, phase-locked loops (PLLs) 244 and 246, and crystal oscillator 248 are combined on a single integrated circuit die 260.

Here, rather than tuning tracking bandpass filters and tank circuits to filter out all but the desired channel, receiver 200 mixes the broadband $RF_{IN}$ signal with a local oscillator signal chosen to mix the desired channel to a high IF which is the center frequency of a highly selective bandpass filter (e.g., SAW filter 220). The high IF is above a desired IF, so receiver 200 then mixes the filtered signal to the desired IF. In operation, signal $RF_{IN}$ is adjusted to a level that will not overpower IF mixer 218 by first passing through buffer 212, attenuator 214 and VLNA 216. The power level at the input to RF mixer 218 is detected by power detector 234 and AGC circuit 238 provides a gain adjustment signal to attenuator 214 and VLNA 216 via signal $AGC_{RF}$. Mixer 118 combines the gain adjusted signal with the output from local oscillator 240, to produce sum and difference output frequencies:

$$f_1 = f_{RF} + f_{LO} \qquad [3]$$

and $$f_2 = f_{RF} - f_{LO} \qquad [4]$$

where $f_{RF}$ is the carrier frequency of a desired channel of signal $RF_{IN}$ and $f_{LO}$ is the local oscillator frequency. Local oscillator 240 is driven by PLL 244, which is adjusted such that the desired channel's spectrum is mixed into the passband of SAW filter 220. The signals $f_1$ and $f_2$ include components that correspond to the unfiltered signal $RF_{IN}$, but the undesired channel components are filtered out by SAW filter 220. The center frequency of SAW filter 220 is typically around 1 gigahertz (GHz). IF mixer 226 combines the output of SAW filter 220 with the output from local oscillator 242, to produce the desired IF signal, which passes through SAW filter 228 and variable gain amplifier 230 before being demodulated by demodulator 232 into signal $TV_{OUT}$.

Receiver 200, with the high selectivity of SAW filter 220 solves several problems with receiver 100, such as elimination of discrete high quality inductors, varactors and the associated DC-DC converter, and reduction of the LO tuning range. However, receiver 200 has introduced an additional discrete component, SAW filter 228, so the reduction in overall size is minor. Furthermore, the addition of the mixer 226 and PLL 246 to implement the up-down architecture makes the integrated circuit die 260 larger. Also, the absence of tracking filters increases the linearity requirements for VLNA 216 and IF mixer 226, and results in greater power consumption.

Figure 3:
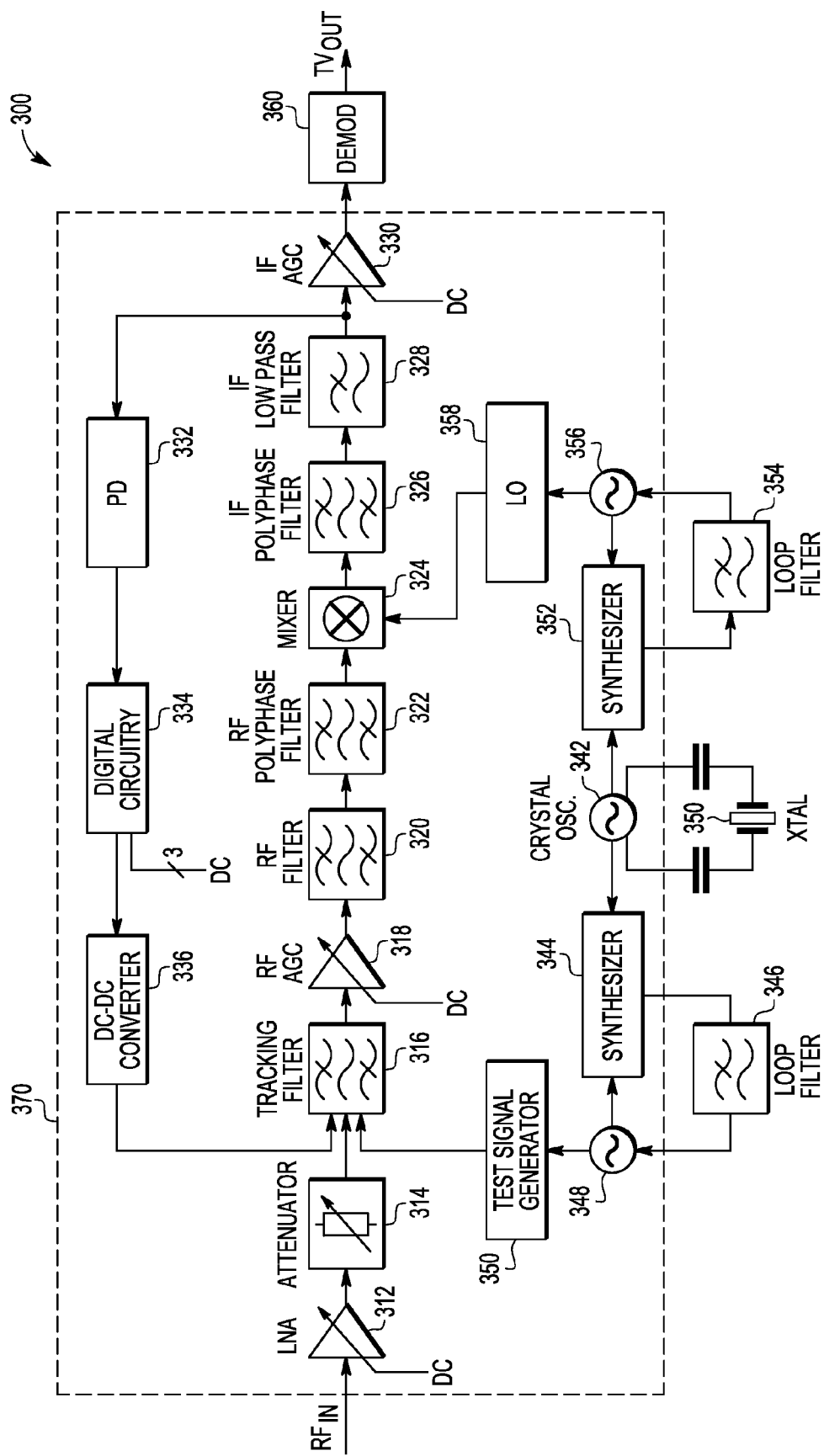
FIG. 3 illustrates in partial block diagram and partial schematic form a third television receiver known in the prior art.

FIG. 3 illustrates in partial block diagram and partial schematic form a third television receiver 300 known in the prior art. Receiver 300 includes a LNA 312, an attenuator 314, a tracking filter 316, an RF AGC amplifier 318, an RF filter 320, an RF polyphase filter 322, a mixer 324, an IF polyphase filter 326, an IF lowpass filter 328, an IF AGC amplifier 330, a power detector 332, a digital control circuit 334, a DC-DC converter 336, a crystal 340, a crystal oscillator 342, a synthesizer 344, a loop filter 346, an oscillator 348, a test signal generator 350, a synthesizer 352, a loop filter 354, an oscillator 356, and a local oscillator generator 358.

LNA 312 has a first input for receiving an RF input signal $RF_{IN}$, a second input, and an output. Attenuator 314 has an input connected to the output of LNA 312, and an output. Tracking filter 316 has a first input connected to the output of attenuator 314, a second input, and an output. RF AGC amplifier 318 has a first input connected to the output of tracking filter 316, a second input, and an output. RF filter 320 has an input connected to the output of RF AGC amplifier 318, and an output. RF polyphase filter 322 has an input connected to the output of RF filter 320, and an output. Mixer 324 has a first input connected to the output of RF filter 320, a second input, and an output. IF polyphase filter 326 has an input connected to the output of mixer 324, and an output. IF lowpass filter 328 has an input connected to the output of IF polyphase filter 326, and an output. IF AGC amplifier 330 has a first input connected to the output of IF lowpass filter 328, a second input, and an output. Demodulator 360 has an input connected to the output of IF AGC amplifier 330, and an output for providing a demodulated output signal $TV_{OUT}$.

Power detector 332 has an input connected to the output of IF lowpass filter 328, and an output. Digital control circuit 334 has an input connected to the output of power detector 332, a first output connected to the second input of LNA 312, the second input of RF AGC amplifier 318, and the second input of IF AGC amplifier 330, and a second output. DC-DC converter 336 has an input connected to the second output of digital control circuit 334, and an output connected to the second input of tracking filter 316.

Crystal 340 has first and second terminals. Crystal oscillator 342 has a first input connected through a capacitor to the first terminal of crystal 340, a second input connected through a capacitor to the second terminal of crystal 340, a first output, and a second output. Synthesizer 344 has a first input connected to the first output of crystal oscillator 342, a second input, and an output. Loop filter 346 has an input connected to the output of synthesizer 344, and an output. Oscillator 348 has an input connected to the output of loop filter 346, a first output connected to the second input of synthesizer 344, and a second output. Test signal generator 350 has an input connected to the second output of oscillator 348, and an output connected to the first input of tracking filter 316. Synthesizer 352 has a first input connected to the second output of crystal oscillator 342, a second input, and an output. Loop filter 354 has an input connected to the output of synthesizer 352, and an output. Oscillator 356 has an input connected to the output of loop filter 354, a first output connected to the second input of synthesizer 354, and a second output. Local oscillator generator 358 has an input connected to the second output of oscillator 356, and an output connected to the second input of mixer 324.

In operation, receiver 300 functions similarly to receiver 100, tuning into a desired television channel by passing signal $RF_{IN}$ through tracking filter 316 to attenuate the television channels outside of the desired passband. As such, tracking filter 316 includes inductors and varactors. Receiver 300 exhibits a further degree of integration over receivers 100 and 200, wherein LNA 312, attenuator 314, tracking filter 316, RF AGC amplifier 318, RF filter 320, RF polyphase filter 322, mixer 324, IF polyphase filter 326, IF lowpass filter 328, IF AGC amplifier 330, power detector 332, digital control circuit 334, DC-DC converter 336, crystal oscillator 342, synthesizer 344, oscillator 348, test signal generator 350, synthesizer 352, and oscillator 356 are combined on a system-in-package (SIP) receiver 370. In this approach, the inductors and varactors are surface mount devices (SMDs) soldered onto a laminate substrate along with a tuner die. The varactor SMDs are of a high voltage type, necessitating DC-DC converter 336, which operates at voltages up to 30 volts. Thus, in order to integrate DC-DC converter 336 onto the tuner die, the tuner die is implemented in a high voltage bipolar junction transistor complementary metal-oxide-silicon (HV BiCMOS) process.

To tune tracking filter 316, an off-line calibration tone is injected from test signal generator 350 into tracking filter 316, and the power level is measured at power detector 332. Because power measurement is done in the IF section, two tones are needed in order to tune tracking filter: the calibration tone, and the LO tone. Thus, two separate synthesizers are required to perform calibration. While receiver 300 achieves greater integration and a smaller footprint than receivers 100 and 200, the necessity of SMD inductors and varactors, and the expensive HV BiCMOS process means the cost savings are minimal compared to receivers 100 and 200. Additionally, the requirement to include DC-DC converter 336 and synthesizer 352 prevents further reduction in die size. Thus, further integration while maintaining high performance would be desirable.

Figure 4:
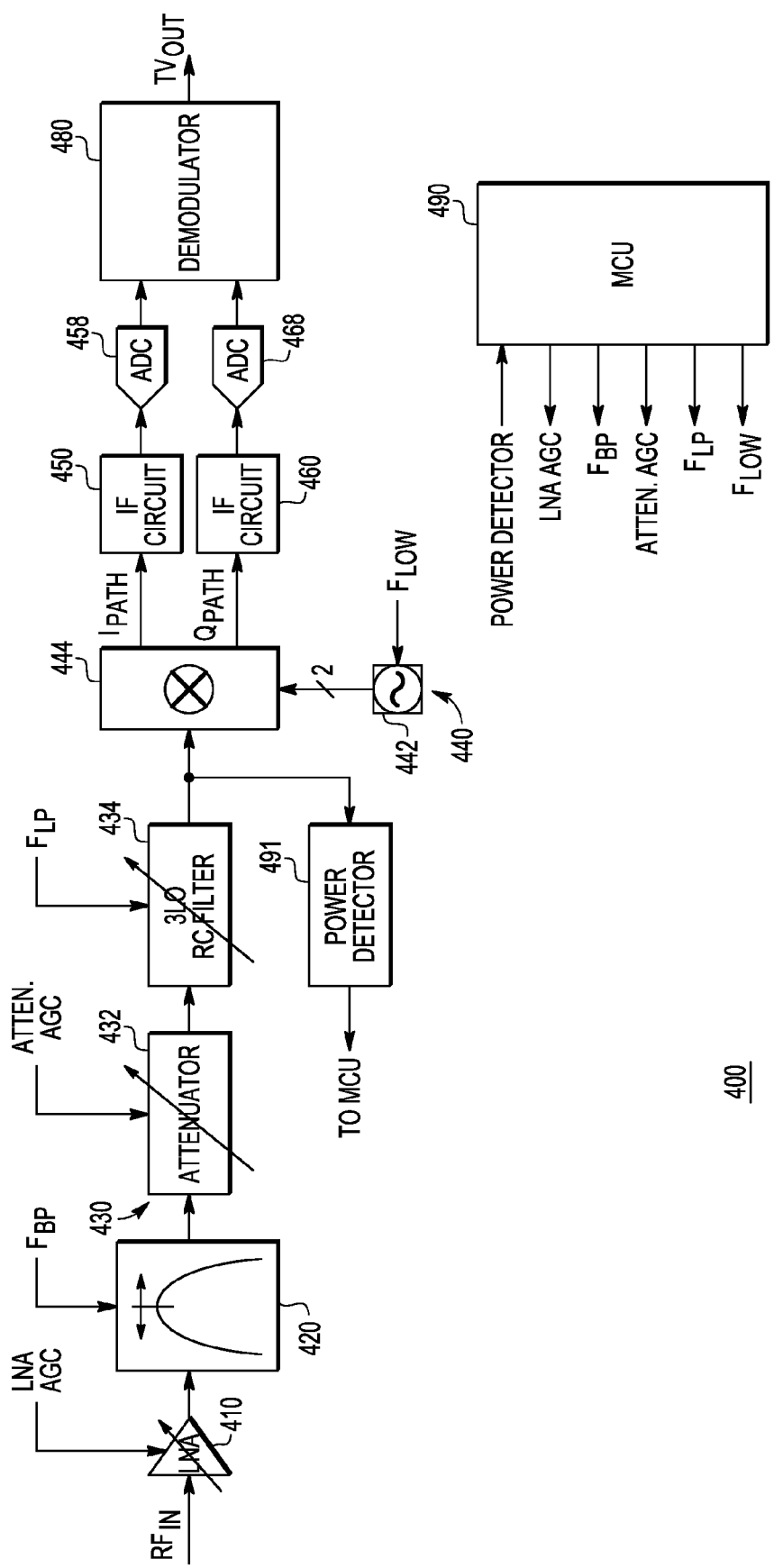
FIG. 4 illustrates in partial block diagram and partial schematic form a television receiver according to an embodiment of the present invention.

FIG. 4 illustrates in partial block diagram and partial schematic form a television receiver 400 according to an embodiment of the present invention. Receiver 400 includes generally a low noise amplifier (LNA) 410, a tracking bandpass filter 420, a preconditioning circuit 430, a mixing circuit 440, a first intermediate frequency (IF) processing circuit 450, a second IF processing circuit 460, a first analog-to-digital converter (ADC) 458, a second ADC 468, a demodulator 480, a microcontroller unit (MCU) 490, and a power detector 491. LNA 410 has a first input for receiving an RF input signal $RF_{IN}$, a second input for receiving a gain control signal LNA AGC, and an output. Tracking bandpass filter 420 has a first input connected to the output of LNA 410, a second input for receiving a tuning signal labeled "$F_{BP}$", and an output.

Preconditioning circuit 430 includes an attenuator 432 and a filter 434. Attenuator 432 has a first input connected to the output of tracking bandpass filter 420, a second input for receiving an attenuation control signal labeled "ATTEN AGC", and an output. Filter 434 has a first input connected to the output of attenuator 432, a second input for receiving a cutoff frequency adjustment signal labeled "$F_{LP}$", and an output.

Mixing circuit 440 includes a local oscillator 442, and a mixer 444. Local oscillator 442 has an input for receiving a local oscillator tuning signal labeled "$F_{LO}$", and a first output for providing two mixing signals, including an in-phase mixing signal and a quadrature mixing signal, and a second output for providing a test signal labeled "TEST" connected to the first input of tracking bandpass filter 420. Mixer 444 has a first input connected to the output of filter 434, a second input connected to the output of local oscillator 442, a first output for providing an in-phase IF signal, and a second output for providing a quadrature IF signal.

IF circuit 450 has an input connected to the first output of mixer 444, and an output. IF circuit 460 has an input connected to the second output of mixer 444, and an output. ADC 458 has an input connected to the output of IF circuit 450, and an output for providing a 3-bit digital output signal. ADC 468 has an input connected to the output of IF circuit 460, and an output for providing a 3-bit digital output signal. Demodulator 480 has inputs connected to the outputs of ADCs 458 and 468, and an output for providing a demodulated output signal $TV_{OUT}$.

MCU 490 has an input, and outputs for providing the LNA AGC, $F_{BP}$, ATTEN AGC, $F_{LP}$, and $F_{LO}$ control signals. Power detector 491 has an input connected to the output of filter 434, and an output connected to the input of MCU 490. MCU 490 can control receiver 400 by providing control signals LNA AGC, $F_{BP}$, ATTEN AGC, $F_{LP}$, and $F_{LO}$ as discrete outputs, as shown in FIG. 4, or by communicating the control signals over a serial interface from which they are received and driven.

In operation, receiver 400 functions as a television receiver adapted to receive and demodulate television channels. MCU 490 is adapted to control the various elements in receiver 400 according to the channel selected by the user. Receiver 400 uses a dual-filter architecture for the pre-mixing tuner. Signal $RF_{IN}$ is received and amplified as necessary in LNA 410 under the control of MCU 490 via signal LNA AGC. Receiver 400 is thus able to present a signal to the input of tracking bandpass filter 420 at a suitable level. Receiver 400 utilizes digital automatic gain control using power detector 491 and MCU 490.

Tracking bandpass filter 420 is a second-order LC filter that assists in providing image rejection by filtering neighboring channels, a significant part of whose energy could be reflected back into the passband. As will be described later with reference to FIG. 6, tracking bandpass filter 420 is implemented as an inductor with an array of switched capacitors, the selection of which functions to tune the center frequency of the passband of tracking bandpass filter 420 under the control of MCU 490 via signal $F_{BP}$. In calibrating tracking bandpass filter 420, a test signal is provided to the first input of tracking bandpass filter 420, and the power output of filter 434 is measured by power detector 491. As will be further described later with reference to FIG. 7, tracking bandpass filter 420 is implemented in part on an integrated circuit substrate containing the other elements of receiver 400, and part on an integrated passive device (IPD) die.

Attenuator 432 functions as a separately controllable gain element under the control of MCU 490 via signal ATTEN AGC such that MCU 490 can properly divide the attenuation between different portions of the signal processing path. Filter 434 provides additional attenuation above the third harmonic of the mixing signal under the control of MCU 490 via signal $F_{LP}$ to prevent unwanted energy from a neighboring channel from being mixed into the passband. This frequency is important because local oscillator 442 uses a digital mixing signal that is a square wave, which has significant energy at its third harmonic.

Mixer 444 is a quadrature mixer that mixes the filtered and attenuated RF input signal with the signal from local oscillator 442 to mix a selected channel to a desired IF. In receiver 400, the desired IF is selectable in the range of 3 to 5 megahertz (MHz), and thus receiver 400 is configurable as a low-IF architecture. Additionally, receiver 400 is also configurable as a direct down conversion receiver using zero IF. To achieve the desired IF, local oscillator 442 is tuned to a frequency that mixes the selected channel to the desired IF, under the control of MCU 490 via signal $F_{LO}$. In other embodiments, receiver 400 may use a high-IF architecture. After reading this disclosure, it will be appreciated that receiver 400 is configurable to be compatible with various television standards around the world.

Each of IF circuits 450 and 460 perform further signal conditioning, including lowpass filtering to pass signals below a cutoff frequency of between 7 and 9 MHz, and further gain stages under the control of MCU 490. ADCs 458 and 468 convert their respective input signals to the digital domain, such that demodulator 480 can demodulate them digitally and provide signal $TV_{OUT}$.

By using the tracking bandpass filter approach with an LC type filter, receiver 400 is able to obtain high quality filtering and low signal-to-noise ratio at low cost. The RF filtering is shared between tracking bandpass filter 420 and lowpass filter 434, which eases the quality required of tracking bandpass filter 420. The array of switched capacitors of tracking bandpass filter 420 is efficiently fabricated on a receiver die that also includes LNA 410, preconditioning circuit 430, mixing circuit 440, first intermediate frequency (IF) processing circuit 450, second IF processing circuit 460, first analog-to-digital converter (ADC) 458, second ADC 468, demodulator 480, microcontroller unit (MCU) 490, and power detector 491. Moreover, the inductors of tracking bandpass filter 420 are efficiently fabricated on an integrated passive device (IPD) die, as will be more fully explained with respect to FIG. 7 below. Thus, receiver 400 achieves high quality at low cost.

Figure 5:
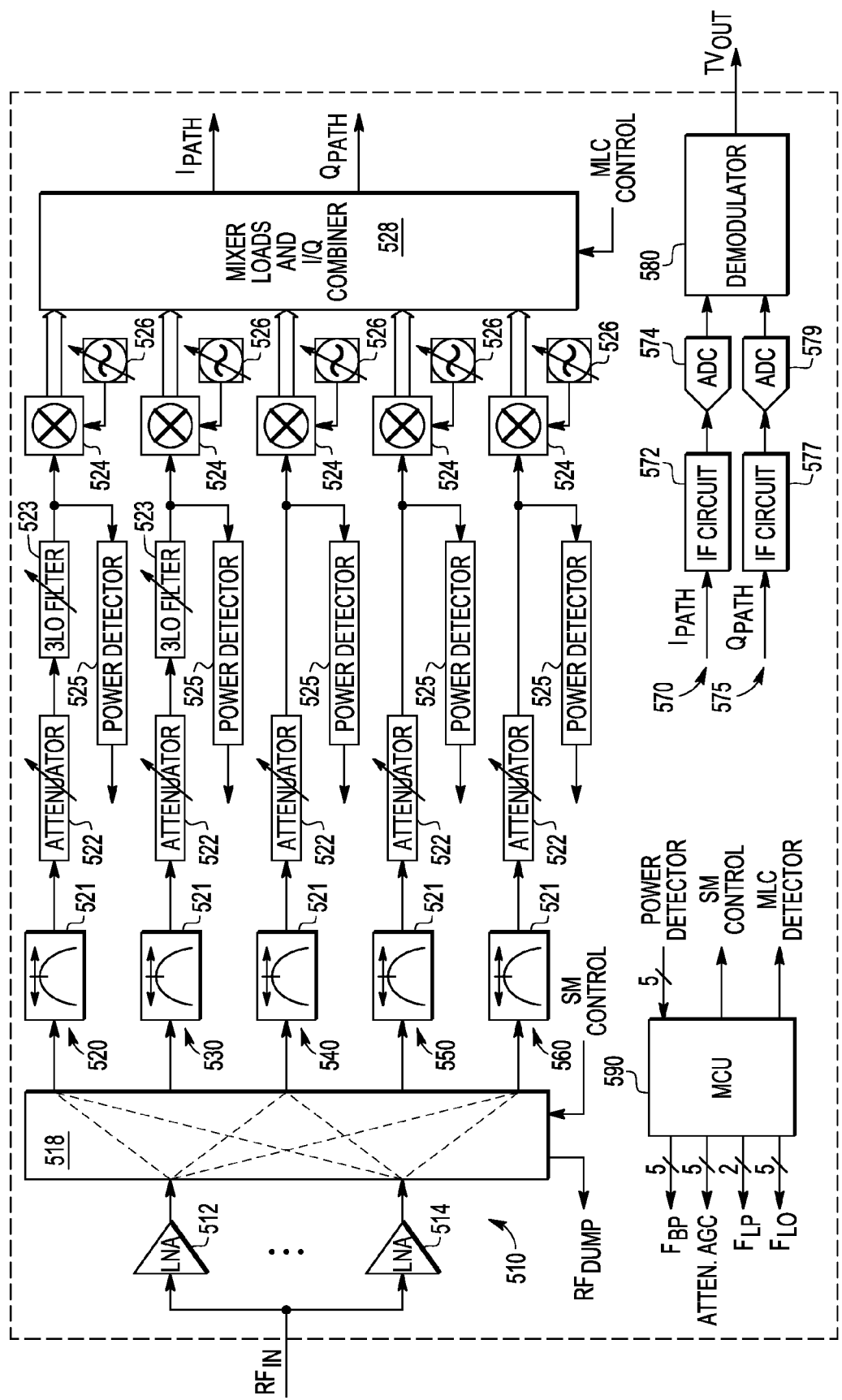
FIG. 5 illustrates in partial block diagram and partial schematic form a particular embodiment of the television receiver of FIG. 4.

FIG. 5 illustrates in partial block diagram and partial schematic form a particular embodiment of the television receiver 500 of FIG. 4. Receiver 500 includes an input section 510, first through fifth RF sections 520, 530, 540, 550, and 560, a mixer load/I/Q combiner 528, a first IF section 570, a second IF section 575, a demodulator 580 similar to demodulator 480, and an MCU 590 similar to MCU 490. Input section 510 includes a first LNA 512, one or more additional LNA, labeled generally as LNA 514, and a switch matrix 518. Each RF section 520, 530, 540, 550, and 560 includes a tracing bandpass filter 521 similar to tracking bandpass filter 420, an attenuator 522 similar to attenuator 532, a mixer 524 similar to mixer 444, a power detector 525 similar to power detector 491, and a local oscillator 526 similar to local oscillator 442. Further, first RF section 520, and second RF section 530 include a filter 523 similar to filter 434. IF section 570 includes an IF circuit 572 similar to IF circuit 450, and an ADC 574 similar to ADC 458. IF section 575 includes an IF circuit 577 similar to IF circuit 460, and an ADC 579 similar to ADC 468.

Input section 510 receives an RF input signal $RF_{IN}$. LNAs 512 through 514 each have an input for receiving signal $RF_{IN}$, and an output. Switch matrix 518 has a first input connected to the output of LNA 512, one or more additional inputs connected to the output of LNA 514, and a third input for receiving a switch matrix control signal labeled "SM CONTROL", a first through a fifth output, and an RF dump output labeled "$RF_{DUMP}$". RF sections 520, 530, 540, 550, and 560 each have an input for receiving an RF input signal that is connected to an outputs of switch matrix 518, such that the first output is connected to RF section 520, the second output is connected to RF section 530, the third output is connected to RF section 540, the fourth output is connected to RF section 550, and the fifth output is connected to RF section 560. RF sections 520, 530, 540, 550, and 560 also each have a first output for providing an in-phase IF signal, and a second output for providing a quadrature IF signal.

In each of RF sections 520 and 530, tracking bandpass filter 521 has a first input connected through switch matrix 518 and an LNA 512 through 514 to signal $RF_{IN}$, a second input for receiving a tuning signal (not shown in FIG. 5) similar to tuning signal $F_{BP}$, and an output. Attenuator 522 has a first input connected to the output of tracking bandpass filter 521, a second input for receiving an attenuation control signal (not shown in FIG. 5) similar to attenuation control signal ATTEN AGC, and an output. Filter 523 has a first input connected to the output of attenuator 522, a second input for receiving a cutoff frequency adjustment signal (not shown in FIG. 5) similar to cutoff frequency adjustment signal $F_{LP}$, and an output. Local oscillator 526 has an input for receiving a local oscillator tuning signal (not shown in FIG. 5) similar to local oscillator tuning signal $F_{LO}$, a first output for providing two mixing signals, including an in-phase mixing signal and a quadrature mixing signal, and a second output for providing a test signal TEST connected to the first input of tracking bandpass filter 521. Mixer 524 has a first input connected to the output of filter 523, a second input connected to the output of local oscillator 526, a first output for providing an in-phase IF signal, and a second output for providing a quadrature IF signal. Power detector 525 has an input connected to the output of filter 523, and an output. RF sections 540, 550, and 560 include elements that are connected together similarly to RF sections 520 and 530, except that, with no filter 523, the output of attenuator 522 is connected to the first input of mixer 524. In an alternative embodiment, filter 434 does not include a second input, but rather, is a lowpass filter with a cutoff frequency that is substantially equal to twice the frequency of the low end of the frequency range tuned by receiver 400.

Mixer load/I/Q combiner 528 has a first input pair connected to the first and second output of RF section 520, a second input pair connected to the first and second output of RF section 530, a third input pair connected to the first and second output of RF section 540, a fourth input pair connected to the first and second output of RF section 550, a fifth input pair connected to the first and second output of RF section 560, a sixth input for receiving a mixer load/I/Q combiner control signal labeled "MLC CONTROL", a first output for providing an in-phase IF signal, and a second output for providing a quadrature IF signal.

IF section 570 receives the in-phase IF signal output from mixer load/I/Q combiner 528, and provides an in-phase digital signal to demodulator 580. Thus, IF circuit 572 has an input for receiving the in-phase IF signal, and an output. ADC 574 has an input connected to the output of IF circuit 572, and an output for providing a digitized output signal. IF section 575 receives the quadrature IF signal output from mixer load/I/Q combiner 528, and provides a digital signal to demodulator 580. Thus, IF circuit 577 has an input for receiving the quadrature IF signal, and an output. ADC 579 has an input connected to the output of IF circuit 577, and an output for providing a digitized output signal. Demodulator 580 has a first input connected to the output of ADC 574, a second input connected to the output of ADC 579, and an output for providing a demodulated output signal labeled "$TV_{OUT}$".

MCU 590 has five inputs, each connected to the output of one power detector 525, five outputs for providing signals $F_{BP}$, five outputs for providing signals ATTEN AGC, two outputs for providing signals $F_{LP}$, five outputs for providing signals $F_{LO}$, an output connected to the fourth input of switch matrix 518 for providing signal SM CONTROL, and an output connected to the sixth input of mixer load/I/Q combiner 528 for providing signal MLC CONTROL. MCU 590 can implement signals $F_{BP}$, ATTEN AGC, $F_{LP}$, $F_{LO}$, SM CONTROL, and MLC CONTROL as discrete outputs, or signals $F_{BP}$, ATTEN AGC, $F_{LP}$, $F_{LO}$, SM CONTROL, and MLC CONTROL can be implemented by placing the appropriate signal values into buffer devices (not illustrated) which provide the outputs.

In operation, receiver 500 functions as a television receiver similar to receiver 400, being adapted to receive and demodulate television channels in the range of 48 MHz to 1 GHz. MCU 590 is adapted to control the various elements in receiver 500 according to the channel selected by the user. However, here, receiver 500 uses the dual filter architecture in RF sections 520 and 530, while RF sections 540, 550, and 560 use a single filter architecture for the pre-mixing tuner. It will be understood after reading this disclosure that different RF sections can be designed to provide filtering over a different portion of the 48 MHz to 1 GHz range, and that such design can be easier to achieve than with a single RF section. Here, RF sections 520, 530, 540, 550, and 560 are each designed to provide filtering and attenuation for a selected frequency range of signal $RF_{IN}$. For example, in the illustrated embodiment, a first RF section 520 provides filtering and attenuation in the range of 48 to 120 MHz, a second RF section 530 provides filtering and attenuation in the range of 120 to 240 MHz, a third RF section 540 provides filtering and attenuation in the range of 240 to 470 MHz, a fourth RF section 550 provides filtering and attenuation in the range of 470 to 685 MHz, and a fifth RF section 560 provides filtering and attenuation in the range of 685 MHz to 1 GHz.

LNAs 512 through 514 receive and amplify signal $RF_{IN}$. Receiver 500 implements a number of LNAs 512 through 514 that is proportional to the desired gain resolution (i.e., proportional to the number of gain steps desired). Switch matrix 518 receives the amplified signal $RF_{IN}$ from LNAs 512 through 514, and connects each LNA 512 through 514 to either the RF section 520, 530, 540, 550, or 560 that is designed to provide filtering and attenuation for the selected channel, or to the $RF_{DUMP}$ output under the control of MCU 590 via signal SM CONTROL. By switching more or less LNAs 512 and 514, receiver 500 is able to present signal $RF_{IN}$ to the input of the selected one of RF sections 520, 530, 540, 550, or 560 at a suitable power level for the selected tracking bandpass filter 521, and mixer 524. MCU 590 uses the inputs from the selected one of power detectors 525 to determine the number of LNAs 512 and 514 to switch to the input of the corresponding RF sections 520, 530, 540, 550, or 560, thus achieving digital automatic gain control in receiver 500. In another embodiment, not illustrated, one or more LNA is designed to provide variable linear amplification over a different portion of the 48 MHz to 1 GHz range. It will be understood after reading this disclosure that designing such LNAs is easier to achieve than designing a single LNA covering the entire gain and tuning range. Here switch matrix 518 receives signals from the LNAs 512 and 514 that together provide the desired amplification, and switches each of them to the RF section 520, 530, 540, 550, or 550 that is designed to provide filtering and attenuation for the selected channel.

Further, MCU 590 controls the gain by controlling the switching properties of the switch matrix 518.

Each tracking bandpass filter 521 is a second-order LC filter that is implemented as an inductor with an array of switched capacitors, the selection of which functions to tune the center frequency of the passband of tracking bandpass filters 521 under the control of MCU 590 via signals $F_{BP}$, and is further implemented in part on an integrated circuit substrate containing the other elements of receiver 400, and part on an integrated passive device (IPD) die. Attenuators 522 function as separately controllable gain elements under the control of MCU 490 via signals ATTEN AGC. Filters 523 provide additional attenuation above the third harmonic of the mixing signal under the control of MCU 490 via signals $F_{LP}$ to prevent unwanted energy from a neighboring channel from being mixed into the passband. Again, this frequency is important because local oscillators 526 use a digital mixing signal that is a square wave, which has significant energy at its third harmonic. After reading this disclosure, it will be appreciated that a lowpass filter may not be necessary to filter third harmonics of the digital mixing signal frequency for RF sections that handle the higher frequency channels.

Mixers 524 are quadrature mixers that mix the filtered and attenuated RF input signal with the signal from local oscillators 526 to achieve a desired IF signal. Again, the desired IF is 4 MHz, and thus receiver 500 utilizes a low-IF architecture. To achieve the desired IF, local oscillators 526 are tuned to a frequency that mixes a selected channel to the low IF frequency of 4 MHz, under the control of MCU 490 via signal $F_{LO}$. In other embodiments, receiver 500 may use a high-IF or a direct down conversion architecture. Mixer load/I/Q combiner 528 receives the in-phase and quadrature IF signals from the selected mixer 524 and switches them to the in-phase IF section 570 and the quadrature IF section 575, respectively, under the control of MCU 590 via signal MLC CONTROL.

Each of IF circuits 572 and 577 perform further signal conditioning, including lowpass filtering to pass frequencies below a cutoff frequency of 7 MHz, and further attenuation. MCU 590 further has outputs, not shown in FIG. 5, for adjusting the gain of the signal through IF circuits 572 and 577. ADCs 574 and 579 convert their respective input signals to the digital domain, such that demodulator 580 can demodulate them digitally and provide signal $TV_{OUT}$.

As with receiver 400, receiver 500 is able to obtain high quality filtering and low signal-to-noise ratio while operating at low cost by using the tracking bandpass filter approach with an LC type filter. Again, the array of switched capacitors of tracking bandpass filters 521 are efficiently fabricated on a low cost CMOS receiver die that also includes input section 510, RF sections 520, 530, 540, 550, and 560, mixer load/I/Q combiner 528, IF sections 570 and 575, demodulator 580, and MCU 590. Likewise, the inductors of tracking bandpass filters 521 are efficiently fabricated on an integrated passive device (IPD) die. Thus, receiver 500 also achieves high quality at low cost.

However, unlike receiver 400 of FIG. 4, receiver 500 separates the receiver RF section in to five separate RF sections 520, 530, 540, 550, and 550 to relax the linearity requirements of the gain elements and tracking filters. This approach leads to further reduction in receiver die size and cost. In another embodiment (not illustrated), filters 523 can be included in additional RF stages 540, 550 or 560 in order to filter images from energy from outside of the 40 MHz to 1 GHz range (e.g., from cellular communications above 1 GHz).

Figure 6:
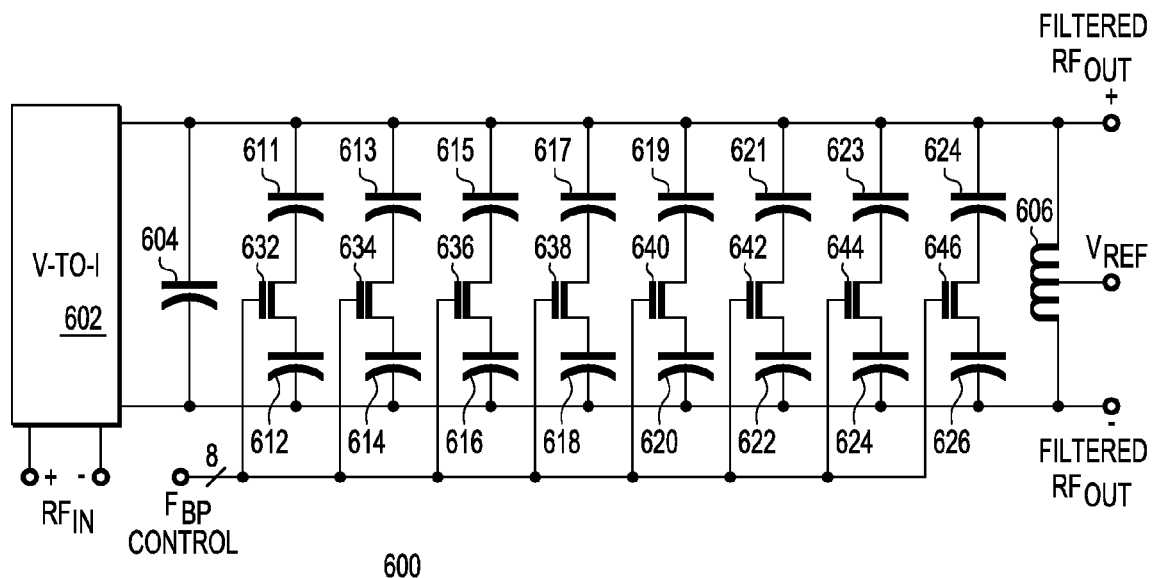
FIG. 6 illustrates in schematic form one of the tracking bandpass filters of FIGS. 4 and 5.

FIG. 6 illustrates in schematic form an embodiment of a tracking bandpass filter 600 suitable for use as tracking bandpass filters 420 and 521 of FIGS. 4 and 5, respectively, and incorporating an array of switched capacitors to achieve center frequency tuning. As illustrated, tracking bandpass filter 600 includes a voltage to current (V-to-I) converter 602, a capacitor 604, an inductor 606, capacitors 611 through 626, and transistors 632, 634, 636, 638, 640, 642, 644, and 646. V-to-I convert 602 has a differential input for receiving an RF input signal labeled "$RF_{IN}$", and a differential output for providing an RF output signal labeled "FILTERED $RF_{OUT}$". Tracking bandpass filter 600 also includes an input for receiving a transistor control signal labeled "$F_{BP}$ CONTROL", and an input for receiving a reference voltage labeled "$V_{REF}$". Capacitor 604 is connected between the differential output of V-to-I converter 602. Inductor 606 is also connected between the differential output of V-to-I converter 602, and has a center tap for receiving reference voltage $V_{REF}$. Capacitors 611, 613, 615, 617, 619, 621, 623, and 625 each include a first terminal connected to the positive side of the differential output of V-to-I converter 602, and a second terminal. Capacitors 612, 614, 616, 618, 620, 622, 624, and 626 each include a first terminal connected to the negative side of the differential output of V-to-I converter 602, and a second terminal. Transistors 632, 634, 636, 638, 640, 642, 644, and 646 are field effect transistors (FETs) that each include a first source/drain terminal connected to the second terminals of capacitors 611, 613, 615, 617, 619, 621, 623, and 625, a gate for receiving the respective one of signal $F_{BP}$, and a second source/drain terminal connected to the second terminals of capacitors 612, 614, 616, 618, 620, 622, 624, and 626.

In operation, tracking bandpass filter 600 tunes its center frequency by switching on one or more of transistors 632, 634, 636, 638, 640, 642, 644, and 646. Transistors 632, 634, 636, 638, 640, 642, 644, and 646 are switched on or off based upon the state of the individual gate of each transistor 632, 634, 636, 638, 640, 642, 644, and 646. In one embodiment, the capacitance of capacitors 612 through 626 can be equal to each other (e.g., 1 picofarad (pF)), and so the overall capacitance is 1 pF when only one transistor is on, 2 pF when two transistors are on, and so on until, where all eight transistors are on, the overall capacitance is 8 pF, and tracking bandpass filter 600 can tune to eight different channels. In another embodiment, tracking bandpass filter 600 can tune to more or less than eight different channels by adding or removing additional capacitor/transistor elements. In yet another embodiment, the capacitors can be binarily weighted, such that the capacitance of capacitors 613 and 614 can be twice the capacitance of capacitors 611 and 612, the capacitance of capacitors 615 and 616 can be twice the capacitance of capacitors 613 and 614, and so on through to capacitors 625 and 626 (e.g., capacitors 611 and 612=1 pF, capacitors 613 and 614=2 pF, capacitors 615 and 616=4 pF, capacitors 617 and 618=8 pF, capacitors 619 and 620=16 pF, capacitors 621 and 622=32 pF, capacitors 623 and 624=64 pF, and capacitors 625 and 626=128 pF). In this way, switching on various combinations of transistors 632, 634, 636, 638, 640, 642, 644, and 646 permits 256 different capacitance values for tracking bandpass filter 600. It will be understood after reading this disclosure that the transistors 632, 634, 636, 638, 640, 642, 644, and 646 can be implemented as P-channel field effect transistors (pFETs), bipolar junction transistors, or other transistor types, as dictated by the design and fabrication considerations of the receiver incorporating the tracking bandpass filter 600.

Incorporating switched capacitors to tune the center frequency of the passband permits tracking bandpass filter 600 to be more fully integrated into a receiver die. This is because the switched capacitor array replaces the varactors of receiver 100 and receiver 300, and eliminates the need for a DC-DC converter. Additionally, the receiver die fabrication technology can be chosen to optimize performance RF performance. Since capacitors are more easily implemented than inductors, using switched capacitors to change the center frequency of tracking bandpass filter 600 makes the architecture of receivers 400 and 500 easy to implement in an integrated circuit.

Figure 7:
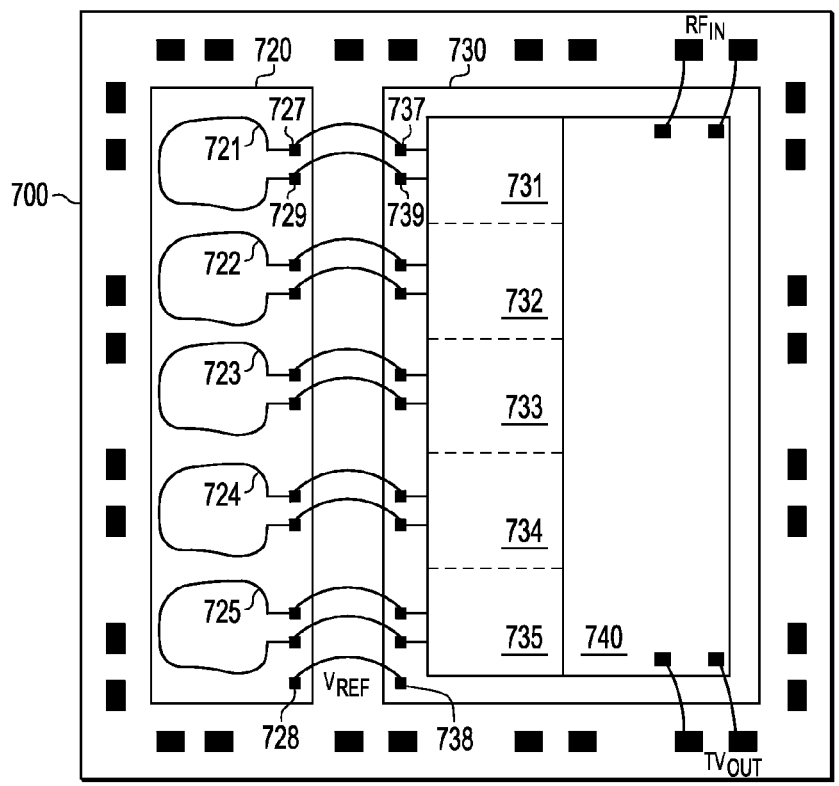
FIG. 7 illustrates a top view of a multi-chip module (MCM) incorporating the receiver of FIG. 5.

FIG. 7 illustrates a top view of a multi-chip module (MCM) 700 incorporating the receiver of FIG. 5, wherein the tracking bandpass filters are implemented using both an IPD die and a receiver die. The elements of MCM 700 are representative, and are not shown in their actual sizes or proportions. MCM 700 includes a substrate 710, an IPD die 720, and a receiver die 730. IPD die 720 and receiver die 730 are mounted to substrate 710. IPD die 720 includes inductors 721, 722, 723, 724, and 725, and a bond pad 728 for receiving reference voltage $V_{REF}$. Each inductor 721, 722, 723, 724, and 725 has a pair of bond pads, shown typically on inductor 721 as bond pads 727 and 729. Receiver die 730 includes switched capacitor arrays 731, 732, 733, 734, and 735, and a bond pad 738 for supplying reference voltage $V_{REF}$. Each switched capacitor array 731, 732, 733, 734, and 735 has a pair of bond pads, shown typically on switched capacitor array 731 as bond pads 737 and 739. Each inductor 721, 722, 723, 724, and 725 is connected to a switched capacitor array 731, 732, 733, 734, and 735, respectively, such that a first connection is made between the bond pad 727 and bond pad 737, and a second connection is made between the bond pad 729 and bond pad 739. Switched capacitor arrays 731, 732, 733, 734, and 735 are connected to the rest of the receiver circuitry 740 on the die level. The rest of the receiver circuitry 740 is also configured to receive an RF input signal $RF_{IN}$, and to provide a television output signal $TV_{OUT}$.

By integrating an input section with LNAs and a switch matrix, multiple RF sections with the switched capacitor array portions of tracking bandpass filters, attenuators, and lowpass filters, a mixer load/I/Q combiner, IF sections, demodulator and MCU on a single receiver die 730, and the inductor portions of tracking bandpass filters on an IPD die, greater levels of integration, size and cost reduction are achieved. Moreover, complimentary metal-oxide-semiconductor (CMOS) manufacturing processes require many process steps for formation of transistors and interconnects. The inductors are formed on a low cost IPD die since inductors do not need many of the CMOS processing steps. However, MCM 700 appears to be a single integrated circuit to the user.

Note that in other embodiments, the inductors on IPD 720 could be implemented in other ways within MCM 700. For example, inductors 721-725 could be implemented as discrete inductors, as traces in the substrate of MCM 700, and in other ways.

Figure 8:
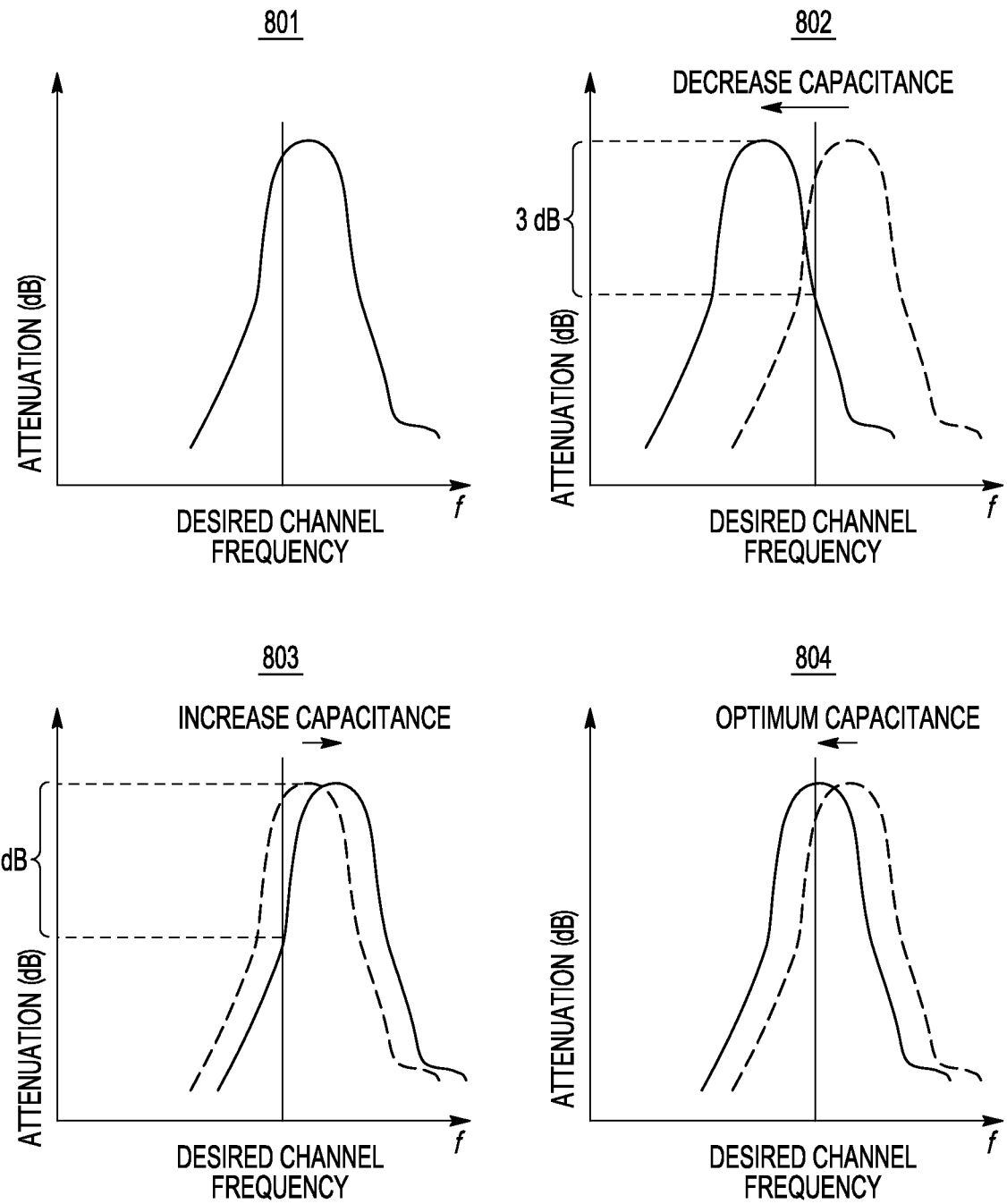
FIG. 8 illustrates a graph of the variation in passband response of the filter of FIG. 6 as capacitance is varied that is useful in understanding a calibration procedure therefor.

FIG. 8 illustrates graphs of the variation in frequency response of the filter of FIG. 6 as capacitance is varied and is useful in understanding a calibration procedure therefore. A graph 801 illustrates the tracking bandpass filter 600. The vertical axis represents attenuation in dB and the horizontal axis represents the frequency f in MHz. The spectrum for a desired channel is created by providing a test tone from the local oscillator 442 or 526, and the resulting power output is measured by the power detector 491 or 525. Note that the tracking bandpass filter passes more RF energy at frequencies above the desired channel frequency than below the desired frequency. It is desirable to balance the RF energy passed above the desired channel frequency with the energy passed below the desired frequency, or, in other words, to center the tracking bandpass filter.

To center the bandpass tracking filter, the MCU finds the peak power level, and the low and high frequency roll-off by switching off capacitors in the switched capacitor array, moving the attenuation curve to the left as illustrated in the graph 802, and switching on capacitors in the switched capacitor array, moving the attenuation curve to the right as illustrated in the graph 803. As the MCU switches capacitors off and on, the power detector measures the output power of the tracking bandpass filter, and the MCU can thus determine which switch combination results in the peak power output, the low frequency roll-off point and the high frequency roll-off point.

The low and high frequency roll-off points can be defined, for example, as the points where the power level is −3 dB below the peak power. In a particular embodiment, the center of the attenuation curve is determined by setting the capacitance of the tracking bandpass filter to be the capacitance level that is half way between the capacitance level of the low frequency roll-off point and the capacitance level of the high frequency roll-off point, as illustrated in the graph 804. In another embodiment, the MCU can record the power level of each switch combination, to determine if one side of the attenuation curve rolls off faster than the other, and can apply an appropriate correction factor in determining the center of the attenuation curve.

Inductor Integration

In order to reduce system cost even further, the inventors have combined the receiver architecture described in FIGS. 4-8 above with integrated, on-chip inductors implemented using advanced integrated circuit manufacturing process technologies.

Figure 9:
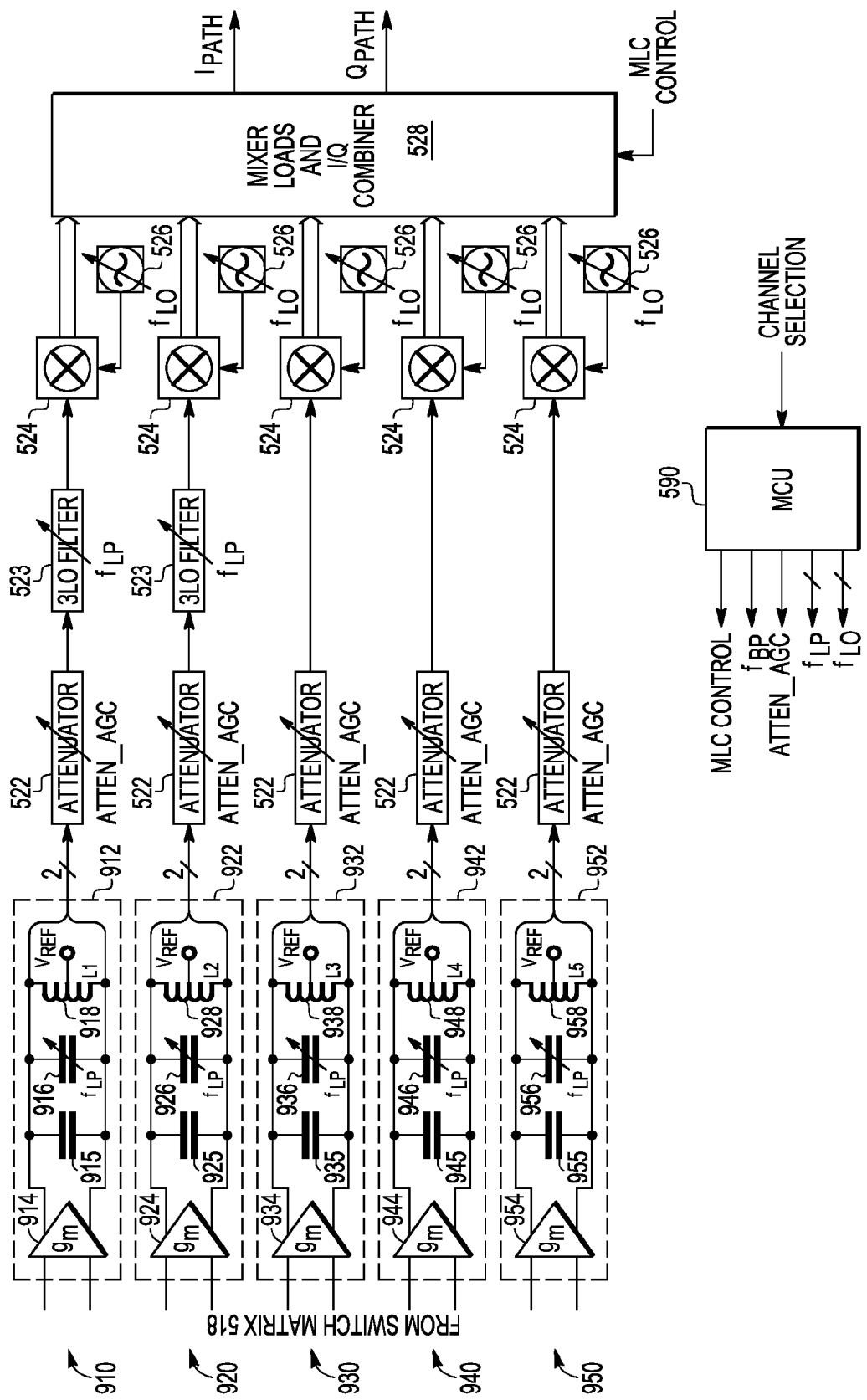
FIG. 9 illustrates in partial block diagram and partial schematic an integrated wideband receiver according to another embodiment of the television receiver of FIG. 5.

FIG. 9 illustrates in partial block diagram and partial schematic an integrated wideband receiver 900 according to another embodiment of television receiver 500 of FIG. 5. Integrated wideband receiver 900 includes five RF sections 910, 920, 930, 940, and 950 each having a fully integrated, on-chip inductor. RF section 910 includes a tracking bandpass filter 912, and attenuator 522, filter 523, mixer 524, and local oscillator 526 as previously described in FIG. 5. Tracking bandpass filter 912 includes a transconductance amplifier 914, a fixed capacitor 915, a variable capacitor 916, and an integrated inductor 918. Transconductance amplifier 914 has first and second differential input terminals connected to switch matrix 518, and first and second differential output terminals. Fixed capacitor 915 has a first terminal connected to the first output terminal of transconductance amplifier 914, and a second terminal connected to the second output terminal of transconductance amplifier 914. Variable capacitor 916 has a first terminal connected to the first output terminal of transconductance amplifier 914, a second terminal connected to the second output terminal of transconductance amplifier 914, and a control terminal for receiving signal $f_{BP}$. Integrated inductor 918 has a first terminal connected to the first output terminal of transconductance amplifier 914, a second terminal connected to the second output terminal of transconductance amplifier 914, and a center terminal (or tap) for receiving a bias voltage labeled "$V_{REF}$".

RF section 920 includes a tracking bandpass filter 922, and attenuator 522, filter 523, mixer 524, and local oscillator 526 as previously described in FIG. 5. Tracking bandpass filter 922 includes a transconductance amplifier 924, a fixed capacitor 925, a variable capacitor 926, and an integrated inductor 928. Transconductance amplifier 924 has first and second differential input terminals connected to switch matrix 518, and first and second differential output terminals. Fixed capacitor 925 has a first terminal connected to the first output terminal of transconductance amplifier 924, and a second terminal connected to the second output terminal of transconductance amplifier 924. Variable capacitor 926 has a first terminal connected to the first output terminal of transconductance amplifier 924, a second terminal connected to the second output terminal of transconductance amplifier 924, and a control terminal for receiving signal $f_{BP}$. Integrated inductor 928 has a first terminal connected to the first output terminal of transconductance amplifier 924, a second terminal connected to the second output terminal of transconductance amplifier 924, and a center terminal for receiving $V_{REF}$.

RF section 930 includes a tracking bandpass filter 932, and attenuator 522, filter 523, mixer 524, and local oscillator 526 as previously described in FIG. 5. Tracking bandpass filter 932 includes a transconductance amplifier 934, a fixed capacitor 935, a variable capacitor 936, and an integrated inductor 938. Transconductance amplifier 934 has first and second differential input terminals connected to switch matrix 518, and first and second differential output terminals. Fixed capacitor 935 has a first terminal connected to the first output terminal of transconductance amplifier 934, and a second terminal connected to the second output terminal of transconductance amplifier 934. Variable capacitor 936 has a first terminal connected to the first output terminal of transconductance amplifier 934, a second terminal connected to the second output terminal of transconductance amplifier 934, and a control terminal for receiving signal $f_{BP}$. Integrated inductor 938 has a first terminal connected to the first output terminal of transconductance amplifier 934, a second terminal connected to the second output terminal of transconductance amplifier 934, and a center terminal for receiving $V_{REF}$.

RF section 940 includes a tracking bandpass filter 942, and attenuator 522, filter 523, mixer 524, and local oscillator 526 as previously described in FIG. 5. Tracking bandpass filter 942 includes a transconductance amplifier 944, a fixed capacitor 945, a variable capacitor 946, and an integrated inductor 948. Transconductance amplifier 944 has first and second differential input terminals connected to switch matrix 518, and first and second differential output terminals. Fixed capacitor 945 has a first terminal connected to the first output terminal of transconductance amplifier 944, and a second terminal connected to the second output terminal of transconductance amplifier 944. Variable capacitor 926 has a first terminal connected to the first output terminal of transconductance amplifier 944, a second terminal connected to the second output terminal of transconductance amplifier 944, and a control terminal for receiving signal $f_{BP}$. Integrated inductor 948 has a first terminal connected to the first output terminal of transconductance amplifier 944, a second terminal connected to the second output terminal of transconductance amplifier 944, and a center terminal for receiving $V_{REF}$.

RF section 950 includes a tracking bandpass filter 922, and attenuator 522, filter 523, mixer 524, and local oscillator 526 as previously described in FIG. 5. Tracking bandpass filter 952 includes a transconductance amplifier 954, a fixed capacitor 955, a variable capacitor 956, and an integrated inductor 958. Transconductance amplifier 954 has first and second differential input terminals connected to switch matrix 518, and first and second differential output terminals. Fixed capacitor 955 has a first terminal connected to the first output terminal of transconductance amplifier 954, and a second terminal connected to the second output terminal of transconductance amplifier 954. Variable capacitor 956 has a first terminal connected to the first output terminal of transconductance amplifier 954, a second terminal connected to the second output terminal of transconductance amplifier 954, and a control terminal for receiving signal $f_{BP}$. Integrated inductor 958 has a first terminal connected to the first output terminal of transconductance amplifier 954, a second terminal connected to the second output terminal of transconductance amplifier 954, and a center terminal for receiving $V_{REF}$.

In operation, integrated wideband receiver 900 forms another embodiment of integrated circuit receiver 500 of FIG. 5. Unlike MCM 700 shown in FIG. 7, however, integrated wideband receiver 900 uses fully integrated, on-chip inductors. Splitting the signal processing path into sub-paths corresponding to sub-bands of an RF signal spectrum and using separate tracking filters with corresponding integrated inductors for each sub-band allows the inductors to be constructed differently for each corresponding sub-band and to provide good performance at low cost.

Note that like receiver 500, receiver 900 includes lowpass filters 523 only in the processing paths of the two lower frequency bands to attenuate in-band blockers. In an alternate embodiment, however, the receiver could have similar 3LO lowpass filters in the processing paths of all five bands. This alternate embodiment provides better blocker rejection due to lack of sufficient mixer harmonic rejection when out-of-band blockers, such as cellular telephone and wireless local area network signals, are present.

Integrated wideband receiver 900 takes advantage of advanced manufacturing processes to integrate inductors that are tailored for each sub-band. The inventors implemented integrated wideband receiver 900 in a 0.11 micron CMOS process with copper metallization and eight available metal layers. By integrating the inductors into the receiver architecture shown in FIG. 5, the inventors reduced the overall cost of integrated receiver 900 compared to MCM 700 using IPD die 720 shown in FIG. 7.

Moreover the inventors used the capabilities of this manufacturing process to create on-chip inductors whose properties vary according to the band of the filter to achieve both low cost and modular layout. For all frequency bands, the inventors achieved modular layout by using a parallel combination of a fixed capacitor, a variable capacitor, and an integrated inductor while fitting the integrated inductors into approximately the same integrated circuit surface area (i.e. they have the same "footprint").

For lower frequency bands, the inventors designed the inductors for higher inductance but reduced the quality factors ("Qs"). For higher frequency bands that require lower inductance, the inventors designed the inductors with higher Qs.

The quality factor (or Q) of an inductor is the ratio of its inductive reactance to its resistance at a given frequency, and is a measure of its efficiency. The higher the Q factor of the inductor, the closer it approaches the behavior of an ideal, lossless, inductor. Mathematically, the Q factor at a given frequency can be expressed as follows:

$$Q = \frac{\omega L}{R} \quad [5]$$

Thus according to the technique used by integrated wideband receiver 900, tracking bandpass filter 912 uses a higher inductance (L) inductor than any other tracking bandpass filter, whereas bandpass filter 952 uses a higher quality (Q) inductor than any other tracking bandpass filter. By varying the properties of the corresponding inductor, integrated wideband receiver 900 can be manufactured inexpensively and modularly while providing good receiver performance.

Figure 10:
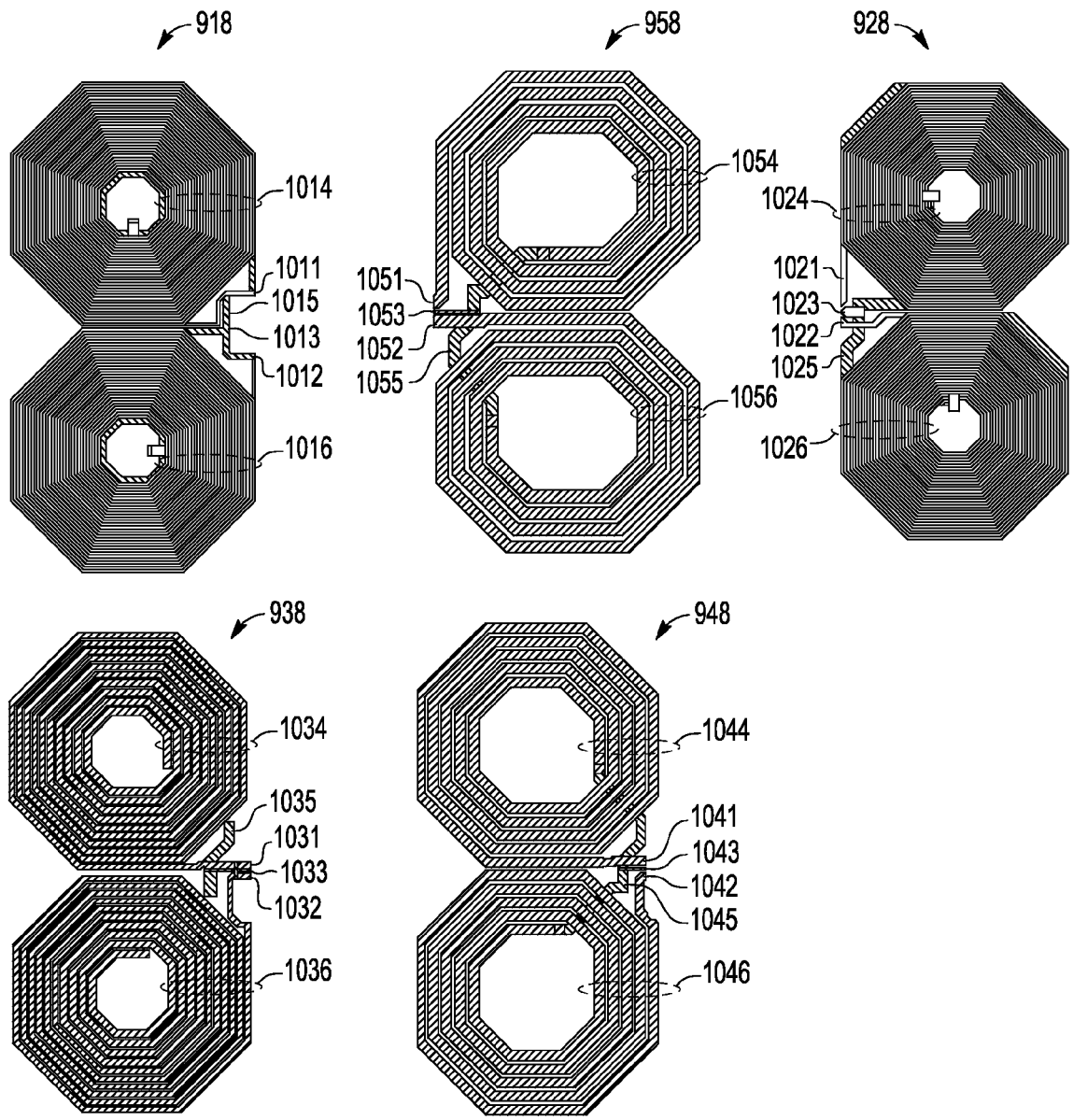
FIG. 10 illustrates a top view of the layout of the five integrated inductors used in the integrated wideband receiver of FIG. 9.

FIG. 10 illustrates a top view of the layout 1000 of the five integrated inductors 918, 928, 938, 948, and 958 used in integrated wideband receiver 900 of FIG. 9. Layout 1000 includes inductor 918 for the lowest frequency band, inductor 928 for the second lowest frequency band, inductor 938 for the middle frequency band, inductor 948 for the second highest frequency band, and inductor 958 for the highest frequency band. Layout 1000 uses a state-of-the art 8-layer metal process with copper as the metallization in which "M8" refers to the topmost metal layer, "M7" refers to the next lower metal layer, and so forth.

Inductor 958 has the lowest inductance and is therefore is the simplest. Inductor 958 is used in tracking bandpass filter 952 for the highest frequency band. Inductor 958 includes a first interconnection point 1051 that forms a first terminal of the inductor, a second interconnection point 1052 that forms a second terminal of the inductor, and a center terminal 1053 for application of bias voltage $V_{REF}$. Inductor 958 includes a first set of four concentric windings 1054 in M8 including an outer winding that starts from interconnection point 1051 and continues through an inner winding. The end of the inner winding connects through an M7 strap 1055 to an inner winding of a second set of four concentric windings 1056 that wraps from the inner winding to an outer winding and that terminates at second interconnection point 1052. Since inductor 958 is not required to have a high inductance, the metal used for concentric windings 1054 and 1056 can be made relatively wide, decreasing the resistance and therefore increasing the Q.

Inductor 948 is used in tracking bandpass filter 942 for the second highest frequency band. Inductor 948 includes a first interconnection point 1041 that forms a first terminal of the inductor, a second interconnection point 1042 that forms a second terminal of the inductor, and a center terminal 1043 for application of bias voltage $V_{REF}$. Inductor 948 includes a first set of five concentric windings 1044 in M8 including an outer winding that starts from interconnection point 1041 and continues through an inner winding. The end of the inner winding connects through an M7 strap 1045 to a second set of five concentric windings 1046 that wraps from an inner winding to an outer winding and that terminates at second interconnection point 1042. The metal used for concentric windings 1044 and 1046 is still relatively wide but not as wide as the metal used in inductor 958. Inductor 948 also includes five windings instead of four to provide higher inductance, but it also has higher resistance and hence lower Q than inductor 958.

Inductor 938 is used in tracking bandpass filter 932 for the middle frequency band. Inductor 938 includes a first interconnection point 1031 that forms a first terminal of the inductor, a second interconnection point 1032 that forms a second terminal of the inductor, and a center terminal 1033 for application of bias voltage $V_{REF}$. Inductor 938 includes a first set of ten concentric windings 1034 in M8 including an outer winding that starts from interconnection point 1031 and continues through an inner winding. Inductor 938 also includes a second set of ten concentric windings 1036 in M8 that wraps from an inner winding to an outer winding and that terminates at second interconnection point 1032. To increase the conductivity of the metal traces and improve the Q factor, inductor 938 uses two similar sets of concentric windings in M7, not shown in FIG. 10, following substantially the same pattern as for the M8 windings. The first and second sets of windings are connected together through an M7 strap 1035. The metal used for concentric windings 1034 and 1036 is not as wide as the metal used in inductor 948. Inductor 938 has more windings than inductor 948 to provide higher inductance, but it also has but higher resistance and hence lower Q than inductor 948.

Inductor 928 is used in tracking bandpass filter 922 for the second lowest frequency band. Inductor 928 includes a first interconnection point 1021 that forms a first terminal of the inductor, a second interconnection point 1022 that forms a second terminal of the inductor, and a center terminal 1023 for application of bias voltage $V_{REF}$. Inductor 928 includes a first set of ten concentric windings 1024 in M8 including an outer winding that starts from interconnection point 1021 and continues through an inner winding. Inductor 928 also includes a second set of ten concentric windings 1036 in M8 that wraps from an inner winding to an outer winding and that terminates at second interconnection point 1032. To increase its inductance, inductor 928 uses similar sets of concentric windings in layers M7 through M3, not shown in FIG. 10, following substantially the same pattern as for the M8 windings. The first and second sets of windings are connected together through an M7 strap 1025. The metal used for concentric windings 1024 and 1026 is not as wide as the metal used in inductor 938. Inductor 928 has more windings than inductor 938 to provide higher inductance, but it also has but higher resistance and hence lower Q than inductor 938.

Inductor 918 is used in tracking bandpass filter 912 for the lowest frequency band. Inductor 918 includes a first interconnection point 1011 that forms a first terminal of the inductor, a second interconnection point 1012 that forms a second terminal of the inductor, and a center terminal 1013 for application of bias voltage $V_{REF}$. Inductor 918 includes a first set of ten concentric windings 1014 in M8 including an outer winding that starts from interconnection point 1011 and continues through an inner winding. Inductor 918 also includes a second set of ten concentric windings 1031 in M8 that wraps from an inner winding to an outer winding and that terminates at second interconnection point 1012. To increase its inductance, inductor 918 uses similar sets of concentric windings in layers M7 through M2, not shown in FIG. 10, following substantially the same pattern as for the M8 windings. The first and second sets of windings are connected together through an M7 strap 1015. The metal used for concentric windings 1014 and 1016 is not as wide as the metal used in inductor 928. Inductor 918 has more windings than inductor 928 to provide higher inductance, but it also has but higher resistance and hence lower Q than inductor 928.

In summary, TABLE I shows the Q of each inductor versus the inductance and the frequency band of interest:

TABLE I

| Inductor | Layers Used for Windings | L | Q | Frequency used for calculating Q |
|---|---|---|---|---|
| L1 | M2-M8 | 680 nH | 2.8 | 50 MHz |
| L2 | M3-M8 | 185 nH | 5.6 | 110 MHz |
| L3 | M7, M8 | 55 nH | 8.8 | 230 MHz |
| L4 | M8 | 19 nH | 13 | 700 MHz |
| L5 | M8 | 11 nH | 15 | 870 MHz |

It should be apparent, however, that these values are just examples of the L/Q tradeoff in the manufacturing process available to the inventors and these values will vary in different manufacturing processes.

Thus the inventors have disclosed three known tracking bandpass filter architectures and two new architectures that provide higher integration and lower cost. TABLE II shows a side-by-side comparison of the different receiver designs disclosed herein:

TABLE II

| FIG. # | Design Name | Implementation of filter |
|---|---|---|
| 1 (prior art) | Discrete | Hand tuned discrete inductor and discrete varactor |

TABLE II-continued

| FIG. # | Design Name | Implementation of filter |
|---|---|---|
| 2 (prior art) | Up-down | Extra external SAW filter |
| 3 (prior art) | SIP receiver | SMD inductor and discrete varactor |
| 5 and 6-8 | MCM with IPD die | IPD inductor and integrated capacitor array |
| 5 and 8-10 | Fully integrated | Integrated inductor and integrated capacitor array |

In other embodiments, integrated inductors such as those disclosed herein can be used in other signal processing elements besides tracking bandpass filters and for other purposes besides RF receivers. Moreover a multi-layer integrated inductor as disclosed herein can be used for other purposes, including but not limited to integrated power converters, noise filters, RF transmitters, and the like.

The above-disclosed subject matter is to be considered illustrative, and not restrictive, and the appended claims are intended to cover all such modifications, enhancements, and other embodiments that fall within the true scope of the claims. Thus, to the maximum extent allowed by law, the scope of the present invention is to be determined by the broadest permissible interpretation of the following claims and their equivalents, and shall not be restricted or limited by the foregoing detailed description.

What is claimed is:

1. An integrated receiver comprising:
   a first signal processing path having an input, and an output for providing a first processed signal, and comprising a first tracking bandpass filter having a first integrated inductor, said first integrated inductor formed with windings in a first number of metal layers of the integrated receiver;
   a second signal processing path having an input, and an output for providing a second processed signal, and comprising a second tracking bandpass filter having a second integrated inductor, said second integrated inductor formed with windings in a second number of metal layers of the integrated receiver, said second number lower than said first number; and
   a controller for enabling one of said first and second signal processing paths corresponding to a selected channel of a radio frequency (RF) input signal to provide an output signal,
   wherein said controller, said first integrated inductor, and said second integrated inductor are formed on a single integrated circuit chip.

2. The integrated receiver of claim 1, wherein said first integrated inductor comprises windings in both a first metal layer and a second metal layer, and said second integrated inductor comprises windings in only said first metal layer.

3. The integrated receiver of claim 1, wherein said first integrated inductor occupies a predetermined planar footprint and said second integrated inductor occupies said predetermined planar footprint.

4. The integrated receiver of claim 1, wherein said controller enables said first signal processing path to tune a first sub-band of a spectrum and said controller enables said second signal processing path to tune a second sub-band of said spectrum covering frequencies higher than said first sub-band.

5. The integrated receiver of claim 4, wherein said spectrum comprises a broadcast television spectrum.

6. The integrated receiver of claim 4, further comprising a plurality of additional signal processing paths corresponding to different sub-bands of said spectrum and having corresponding integrated inductors.

7. The integrated receiver of claim 6, wherein said first integrated inductor is formed in at least three metal layers, said corresponding integrated inductor of said one of said additional signal processing paths is formed in windings of fewer metal layers than said first integrated inductor, and said second integrated inductor is formed in fewer metal layers than said corresponding integrated inductor of said one of said additional signal processing paths.

8. The integrated receiver of claim 1, wherein said first signal processing path further comprises:
a tracking bandpass filter having an input forming said input of said first signal processing path, a tuning input coupled to said controller, and an output, and comprising said first integrated inductor in parallel with a tunable capacitor having a capacitance corresponding to said tuning input; and
a mixer having a signal input coupled to said output of said tracking bandpass filter, a local oscillator input for receiving a local oscillator signal, and an output for providing a converted RF signal.

9. The integrated receiver of claim 1, further comprising:
an input section having an input for receiving said RF input signal, and an output coupled to said inputs of said first and second signal processing paths.

10. The integrated receiver of claim 9, wherein:
said controller further has an output coupled to said input section for providing a gain control signal to control a gain of said RF input signal.

11. An integrated circuit comprising:
a first integrated inductor having a predetermined planar footprint and having first and second terminals, said first integrated inductor formed with windings in a first number of metal layers of the integrated circuit;
a second integrated inductor occupying substantially said predetermined planar footprint and having first and second terminals, said second integrated inductor formed with windings in a second number of metal layers of the integrated circuit, said second number lower than said first number;
a first signal processing circuit including said first integrated inductor; and
a second signal processing circuit having substantially the same function as said first signal processing circuit and including said second integrated inductor.

12. The integrated circuit of claim 11, wherein said first integrated inductor comprises windings in both a first metal layer and a second metal layer, and said second integrated inductor comprises windings in only said first metal layer.

13. The integrated circuit of claim 11, wherein each of said first and second signal processing circuits comprises a tracking bandpass filter formed by a respective one of said first and second integrated inductors.

14. The integrated circuit of claim 11, wherein said first integrated inductor has a greater number of windings than said second integrated inductor, and said second integrated inductor has a greater winding width than said first integrated inductor.

15. The integrated circuit of claim 11, wherein said first metal layer comprises a top metal layer.

16. The integrated circuit of claim 11, wherein said first integrated inductor includes windings in more than two metal layers.

17. A method comprising:
selectively processing a radio frequency (RF) input signal in a first signal processing path having a first integrated inductor formed with windings in a first number of metal layers of an integrated wideband receiver;
selectively processing said RF input signal in a second signal processing path having a second integrated inductor formed with windings formed with windings in a second number of metal layers of said integrated wideband receiver, said second number lower than said first number; and
enabling one of said first and second signal processing paths corresponding to a selected channel of said RF input signal to provide an output signal.

18. The method of claim 17, further comprising:
receiving a channel selection input;
processing said RF input signal in said first signal processing path to tune a first sub-band of a spectrum in response to said channel selection input; and
processing said RF input signal in said second signal processing path to tune a second sub-band of said spectrum in response to said channel selection input.

19. The method of claim 17, wherein said selectively processing said RF input signal in said first signal processing path comprises:
filtering said RF input signal in said first signal processing path by changing a value of a variable capacitor coupled in parallel to said first integrated inductor to form a filtered signal.

20. The method of claim 19, wherein said selectively processing said RF input signal in said first signal processing path further comprises:
mixing said filtered signal with a local oscillator signal selected according to said selected channel.

* * * * *